US009892970B2

(12) United States Patent
Farooq et al.

(10) Patent No.: US 9,892,970 B2
(45) Date of Patent: Feb. 13, 2018

(54) INTEGRATED CIRCUIT STRUCTURE HAVING DEEP TRENCH CAPACITOR AND THROUGH-SILICON VIA AND METHOD OF FORMING SAME

(71) Applicant: GLOBALFOUNDRIES INC., Grand Cayman (KY)

(72) Inventors: Mukta G. Farooq, Hopewell Junction, NY (US); John A. Fitzsimmons, Poughkeepsie, NY (US); Anthony K. Stamper, Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/171,314

(22) Filed: Jun. 2, 2016

(65) Prior Publication Data

US 2017/0352592 A1    Dec. 7, 2017

(51) Int. Cl.
*H01L 21/768* (2006.01)
*H01L 49/02* (2006.01)
(Continued)

(52) U.S. Cl.
CPC .... *H01L 21/76898* (2013.01); *H01L 21/3065* (2013.01); *H01L 21/311* (2013.01); *H01L 21/31051* (2013.01); *H01L 21/76843* (2013.01); *H01L 21/76877* (2013.01); *H01L 23/481* (2013.01); *H01L 23/49827* (2013.01); *H01L 23/49894* (2013.01); *H01L 28/90* (2013.01)

(58) Field of Classification Search
CPC ............. H01L 21/4814; H01L 21/4885; H01L 21/4889; H01L 2021/60007; H01L 2021/60015; H01L 23/49; H01L 28/00
See application file for complete search history.

(56) References Cited

U.S. PATENT DOCUMENTS 5,148,266 A    9/1992  Khandros et al.
6,516,513 B2   2/2003  Milkovich et al.
(Continued)

FOREIGN PATENT DOCUMENTS

CN    103943558 A    7/2014
CN    103956333 A    7/2014

OTHER PUBLICATIONS

U.S. Appl. No. 15/171,320, Office Action 1 dated Apr. 5, 2017, 16 pages.

*Primary Examiner* — Cheng Lee
(74) *Attorney, Agent, or Firm* — Anthony Canale; Hoffman Warnick LLC

(57) ABSTRACT

One aspect of the disclosure relates to a method of forming an integrated circuit structure. The method may include: providing a substrate having a front side and a back side, the substrate including: a deep trench (DT) capacitor within the substrate extending toward the back side of substrate, and a through silicon via (TSV) adjacent to the DT capacitor within the substrate extending toward the back side of the substrate, the TSV including a metal substantially surrounded by a liner layer and an insulating layer substantially surrounding the liner layer; etching the back side of the substrate to expose the TSV on the back side of the substrate; and forming a first dielectric layer covering the exposed TSV on the back side of the substrate and extending away from the front side of the substrate.

19 Claims, 16 Drawing Sheets

(51) Int. Cl.
*H01L 23/48* (2006.01)
*H01L 21/3105* (2006.01)
*H01L 21/311* (2006.01)
*H01L 23/498* (2006.01)
*H01L 21/3065* (2006.01)

(56) References Cited

U.S. PATENT DOCUMENTS

| | | |
|---|---|---|
| 7,863,106 B2 | 1/2011 | Christo et al. |
| 8,242,604 B2 | 8/2012 | Volant et al. |
| 8,298,863 B2 | 10/2012 | Simmons-Matthews |
| 8,394,715 B2 | 3/2013 | Volant et al. |
| 8,658,535 B2 | 2/2014 | Andry et al. |
| 8,691,691 B2 | 4/2014 | Farooq et al. |
| 8,759,154 B2 | 6/2014 | Simmons-Matthews |
| 8,860,230 B2 | 10/2014 | Schmitt et al. |
| 8,956,973 B2 | 2/2015 | Farooq et al. |
| 2009/0127667 A1 | 5/2009 | Iwata |
| 2010/0308435 A1 | 12/2010 | Nowak et al. |
| 2011/0095435 A1 | 4/2011 | Volant et al. |
| 2012/0133021 A1 | 5/2012 | Joblot et al. |
| 2014/0183719 A1 | 7/2014 | Simmons-Matthews |
| 2014/0256088 A1 | 9/2014 | Onodera |
| 2015/0028450 A1* | 1/2015 | Park .................... H01L 23/481 257/532 |

\* cited by examiner

INTEGRATED CIRCUIT STRUCTURE HAVING DEEP TRENCH CAPACITOR AND THROUGH-SILICON VIA AND METHOD OF FORMING SAME

CROSS-REFERENCE TO RELATED APPLICATIONS

This disclosure relates to commonly owned and co-pending application Ser. No. 15/171,320, entitled "INTEGRATED CIRCUIT STRUCTURE HAVING DEEP TRENCH CAPACITOR AND THROUGH-SILICON VIA AND METHOD OF FORMING SAME", filed concurrently herewith, the entire contents of which are herein incorporated by reference.

BACKGROUND

Technical Field

The present disclosure relates to integrated circuit structures, and more particularly, to an integrated circuit structure, such as an integrated circuit structure including an interposer, having a deep trench (DT) capacitor and through-silicon via (TSV) and method of forming the same.

Related Art

Interposers are thinned silicon die which are interposed between active or logic silicon and a packaging substrate. Interposers enable heterogeneous integration of die from various technology nodes to create an optimal cost-performance solution. Interposers with deep trench (DT) capacitors are capable of delivering powerful reductions in mid-frequency noise, thus, further enhancing system performance. Interposers may include through-silicon vias (TSVs) for joining chips (or dies) by vertically interconnecting through the interposer and functioning as components of an integrated circuit.

Stacking chips in comparison to wire bonding, reduces inductive losses which increases speed of data exchange. Since TSVs allow for shorter interconnects between the dies, there is a reduced power consumption caused by the conventional long horizontal wiring. As a result, TSVs allow much higher input/output density than wire bonding, which consumes much more space.

In this manner, TSVs allow multiple integrated circuit chips to be stacked together, allowing greater amounts of information to be passed between the chips. For example, integrated circuit chips and memory devices, which typically reside side-by-side on a silicon wafer, can be stacked on top of one another with the advent of the TSVs. Stacking the integrated circuit chips with the memory devices dramatically reduces the size of the overall chip package and boost speeds at which data flows among the functions on the chip. Signal transmission through TSVs in conventional silicon interposers is not as efficient as with other materials, such as dielectric materials. However, DT capacitors cannot be fabricated in as fine dimensions in dielectric materials as they can be within silicon.

SUMMARY

A first aspect of the disclosure provides for a method of forming an integrated circuit structure. The method may include: providing a substrate having a front side and a back side, the substrate including: a deep trench (DT) capacitor within the substrate extending toward the back side of substrate, and a through silicon via (TSV) adjacent to the DT capacitor within the substrate extending toward the back side of the substrate, the TSV including a metal substantially surrounded by a liner layer and an insulating layer substantially surrounding the liner layer; etching the back side of the substrate to expose the TSV on the back side of the substrate; and forming a first dielectric layer covering the exposed TSV on the back side of the substrate and extending away from the front side of the substrate.

A second aspect of the disclosure provides for a method of forming an integrated circuit structure. The method may include: providing a substrate having a front side and a back side, the substrate including: a deep trench (DT) capacitor within the substrate extending toward the back side of the substrate, etching the substrate on the back side of the substrate to remove at least a portion of the substrate on the back side; forming a first dielectric layer covering the back side of the substrate and extending away from the front side of the substrate; and forming a through silicon via (TSV) adjacent to the DT capacitor, the TSV extending through the first dielectric layer toward the front side of the substrate.

BRIEF DESCRIPTION OF THE DRAWINGS

These and other features of this disclosure will be more readily understood from the following detailed description of the various aspects of the invention taken in conjunction with the accompanying drawings that depict various embodiments of the disclosure, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

The present disclosure relates to integrated circuit structures, and more particularly, to an integrated circuit structure, such as an interposer, having a deep trench (DT) capacitor and through-silicon via (TSV) and method of forming the same. For ease of illustration, the disclosure is discussed as employed for interposers. However, it is to be understood that the disclosure is equally applicable to full device structures, e.g., an active device chip in combination with an interposer, three-dimensional logic chip, etc., as well. Signal transmission through TSVs in conventional silicon or semiconductor interposers is not as efficient as with other materials, such as dielectric materials. However, DT capacitors cannot be fabricated in as fine dimensions in dielectric materials as they can be within silicon or semiconductor. The present disclosure provides for a method and integrated circuit structure that replaces much of the silicon or semiconductor on an interposer with a dielectric material, e.g., polyimide, in order to increase signal transmission through TSVs. Additionally, this method is performed subsequent to the formation of DT capacitors. Therefore, DT capacitors can be fabricated with fine dimensions in silicon before a percentage of the silicon is replaced with dielectric material. The percentage of the silicon that is removed that surrounds the DT capacitors can be determined by a function of DT capacitance requirements versus alpha particles and dielectric leakage loss. For maximum capacitance of the DT capacitors, minimal removal occurs surrounding the DT capacitors, thus the DT capacitors may be fully buried in silicon. As such, the present disclosure both maintains the benefits of having DT capacitors with fine dimensions and increases signal performance of TSVs.

Figure 1:
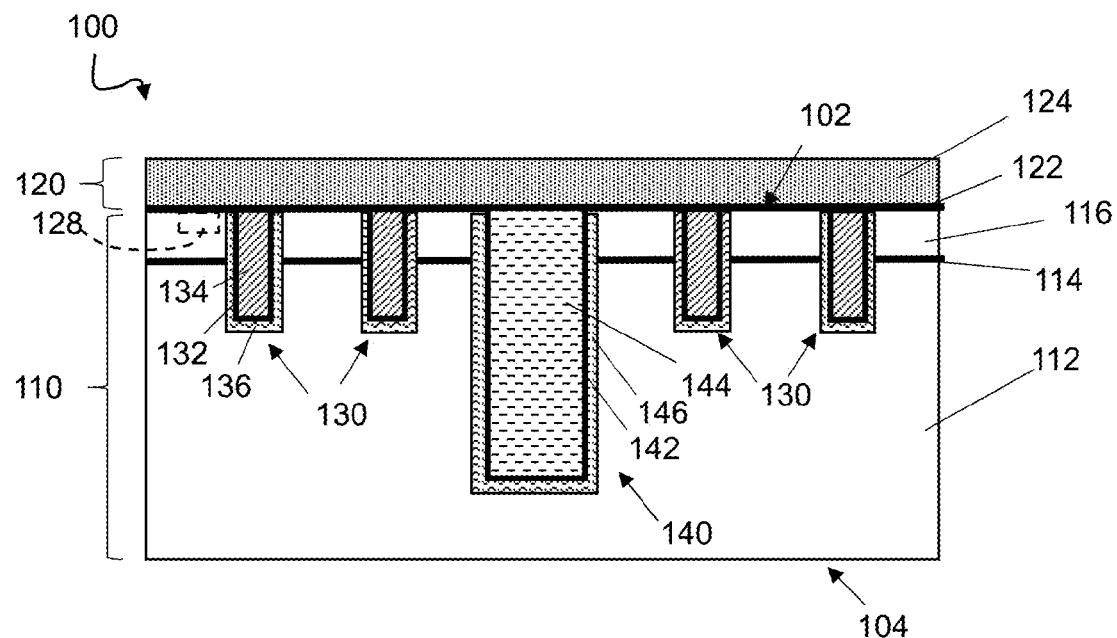
FIGS. 1-3 show cross-sectional views of a wafer undergoing preliminary aspects of a method according to an embodiment of the disclosure.

FIG. 1 shows a cross-sectional view of a preliminary wafer 100, e.g., a passive silicon interposer, that is to undergo aspects of a method according to embodiments of the disclosure as described herein. Wafer 100 may include a substrate 110 having a front side 102 and a back side 104. Substrate 110 may include a semiconductor layer 112. Overlying semiconductor layer 112 as shown in FIG. 1 may be a buried insulator layer 114, and overlying buried insulator layer 114 may be a semiconductor-on-insulator (SOI) layer 116. However, in other embodiments, (not shown) substrate 110 may include a bulk silicon substrate.

Semiconductor layer 112 and SOI layer 116 may each include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Buried insulator layer 114 may include silicon oxide (BOX layer) or other inorganic dielectric materials. As mentioned, substrate 110 may include a bulk silicon substrate in other embodiments.

Wafer 100 may also include a back-end-of-the-line (BEOL) region 120 over front side 102. BEOL region 120 may include a transition region 122 representing the transition from front-end-of-the-line (FEOL) having device structures to BEOL construction. FEOL constructions may reside within SOI layer 116. For example, SOI layer 116 may include integrated circuit devices 128 (shown in phantom), or portions thereof, such as but not limited to: transistors, resistors, interconnects etc. BEOL region 120 may also include BEOL layer 124 having contacts and wiring structures as is known in the art but shown as a single layer/material herein for brevity. Transition region 122 facilitates the prevention of contaminants from BEOL region 120 entering into the FEOL region. Generally, refractory metals and high temperature diffusion barriers against copper and mobile ions, are used in transition region 122. BEOL processing includes the series of processes in which wiring is formed to connect to the semiconductor devices formed during FEOL processing. BEOL processing generally begins when the first layer of metal wiring is formed on the wafer subsequent to transition region 122. In some technologies, the transition region may be called the MOL (middle of line), which connects the FEOL to the BEOL.

Wafer 100 may also include passive devices such as at least one deep trench (DT) capacitor 130. DT capacitors 130 may be disposed within substrate 110 at front side 102 and extend from front side 102 toward back side 104. In some embodiments, DT capacitors 130 may contact BEOL region 120. DT capacitors 130 may include a liner layer 132, e.g., titanium nitride, tantalum nitride, tungsten nitride, tantalum, titanium, or other thermally stable material having attribute for FEOL processing, and an inner conductor layer 134, e.g., polysilicon or other conductor having similar properties or capable of performing similar functions, within liner layer 132. DT capacitors 130 may include an insulating layer 136 which serves as a capacitor dielectric and substantially surrounds liner layer 132 such that liner layer 132 is substantially between insulating layer 136 and inner conductor layer 134. Insulating layer 136 may include, for example, an oxide, such as silicon dioxide or hafnium oxide, or nitride, such as silicon nitride. Insulating layer 136, liner layer 132 and inner conductor layer 134 may be planar with a surface of SOI layer 116 that is on front side 102. As used herein, "substantially" refers to largely, for the most part, entirely specified or any slight deviation which provides the same technical benefits of the invention.

Wafer 100 may also include a through silicon via (TSV) 140. TSV 140 may include a liner layer 142 and a conductive metal layer 144 substantially surrounded by liner layer 142. Liner layer 142 may include, but is not limited to tantalum nitride, titanium nitride, or tungsten nitride, or other equally suitable material to improve adhesion or other structural or electrical properties of the structure to be formed. Liner layer 142 may prevent electromigration of metal from metal layer 144 into a dielectric. Metal layer 144 may include copper or any other suitable conductive material such as, but not limited to, titanium, tungsten, tantalum, aluminum, or alloys thereof. TSV 140 may also include an insulating layer 146 substantially surrounding liner layer 142 such that liner layer 142 is substantially between insulating layer 146 and metal layer 144. Insulating layer 146 may include, for example, an oxide, such as silicon dioxide or hafnium oxide, or nitride, such as silicon nitride.

Wafer 100 may be initially formed by forming buried insulator layer 114 over semiconductor layer 112 and SOI layer 116 over buried insulator layer 114 such as by deposition or wafer bonding, e.g., separation by implantation of oxygen (SIMOX). As used herein, the term "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

Further, trench openings or discrete columnar openings (not shown) may be formed in substrate 110 to facilitate the formation of DT capacitors 130. For ease of description, the term trench openings may represent all such openings. A mask (not shown) may be formed over SOI layer 116 and patterned such that portions of the mask are removed to expose portions of SOI layer 116 thereunder where DT capacitors 130 are to be formed. Exposed portions of SOI layer 116, including buried insulator layer 114 and semiconductor layer 112 thereunder, may then be etched to form the trench openings. Subsequently, the remaining portions of the mask may be removed. Liner layer 132 may be formed, e.g., deposited, within the trench openings to substantially line the trench openings. Inner conductor layer 134 may be formed, e.g., deposited, within the trench openings over liner layer 132. DT capacitors 130 may also include insulating layer 136. In such an embodiment, insulating layer 136 may be formed, e.g., deposited, within the trench openings to substantially line the trench openings prior to the formation of liner layer 132. Insulating layer 136, liner layer 132 and inner conductor layer 134 may be planarized to a surface of SOI layer 116 at front side 102.

The term "mask" may be given to a layer of material which is applied over an underlying layer of material, and patterned to have openings, so that the underlying layer can be processed where there are openings. After processing the underlying layer, the mask may be removed. Common masking materials are either organic, e.g., a photoresist (resist), or inorganic, e.g., an oxide and nitride. Inorganic materials such as oxide or nitride are usually considered to be a "hard mask." Many times this hard mask may be used in conjunction with a soft mask (resist). The materials for the mask may be selected based on requirements such as opacity to the laser wavelength used, and selectivity to the etches used.

"Etching" generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a chemical (such as an acid) which may be chosen for its ability to selectively dissolve a given material (such as oxide), while leaving another material (such as polysilicon) relatively intact. The ability to selectively etch particular materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutral or charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

Planarization refers to various processes that make a surface more planar (that is, more flat and/or smooth). Chemical-mechanical-polishing (CMP) is one currently conventional planarization process which planarizes surfaces with a combination of chemical reactions and mechanical forces. CMP uses slurry including abrasive and corrosive chemical components along with a polishing pad and retaining ring, typically of a greater diameter than the wafer. The pad and wafer are pressed together by a dynamic polishing head and held in place by a plastic retaining ring. The dynamic polishing head is rotated with different axes of rotation (that is, not concentric). This removes material and tends to even out any "topography," making the wafer flat and planar.

Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; gas-cluster ion-beam; and/or (x) sacrificial etch-back.

In one method of construction, additional openings (not shown) may be formed in substrate 110 to facilitate the formation of TSV 140 adjacent to at least one DT capacitor 130. That is, a mask (not shown) may be formed over SOI layer 116 and patterned such that portions of the mask are removed to expose portions of SOI layer 116, including buried insulator layer 114 and semiconductor layer 116 thereunder, where TSV 140 is to be formed. The exposed portions of SOI layer 116 may then be etched to form the openings, and the remaining portions of the mask may be removed. Liner layer 142 may be formed, e.g., deposited, within the openings to substantially line the openings. Metal layer 144 may be formed, e.g., deposited, within the openings over liner layer 142 to substantially fill the opening. TSV 140 may also include insulating layer 146. In such an embodiment, insulating layer 146 may be formed, e.g., deposited, within the opening to substantially line the opening prior to the formation of liner layer 142. Insulating layer 146, liner layer 142 and metal 144 may be planarized to a surface of SOI layer 116 at front side 102. This method is typically denoted as a middle of line TSV integration. Subsequent processing for the back end region continues the structure to termination.

Further, BEOL region 120 may be formed over SOI layer 116 on front side 102 of substrate 110 extending away from back side 104. That is, BEOL layer 124 may be formed as known in the art to include several metal wiring levels that facilitate the connection to both active and passive semiconductor devices within the structure including the transition region 122 from BEOL layer 124 and FEOL region, i.e., SOI layer 116, is formed over SOI layer 116, DT capacitors 130, and TSV 140. In other embodiments (not shown), TSV 140 may be formed at a desired time during formation of BEOL region 120 depending on the desired application of wafer 100. In such an embodiment, TSV 140 may extend at least partially through BEOL region 120.

In another method of construction, additional openings (not shown) may be formed in substrate 110 to facilitate the formation of TSV 140 adjacent to at least one DT capacitor 130. That is, a mask (not shown) may be formed over BEOL 124 and patterned such that portions of the mask are removed to expose portions of BEOL layer 124, with subsequent exposure of transition region 122, SOI layer 116, buried insulator layer 114, and semiconductor layer 116 thereunder, where TSV 140 is to be formed. The exposed portions of BEOL 124 may then be etched to form the openings, and the remaining portions of the mask may be removed. Liner layer 142 may be formed, e.g., deposited, within the openings to substantially line the openings. Metal layer 144 may be formed, e.g., deposited, within the openings over liner layer 142 to substantially fill the opening. TSV 140 may also include insulating layer 146. In such an embodiment, insulating layer 146 may be formed, e.g., deposited, within the opening to substantially line the opening prior to the formation of liner layer 142. Insulating layer 146, liner layer 142 and metal 144 may be planarized to a surface of SOI layer 116 at front side 102. This method is typically denoted as back end of line TSV integration.

Figure 2:
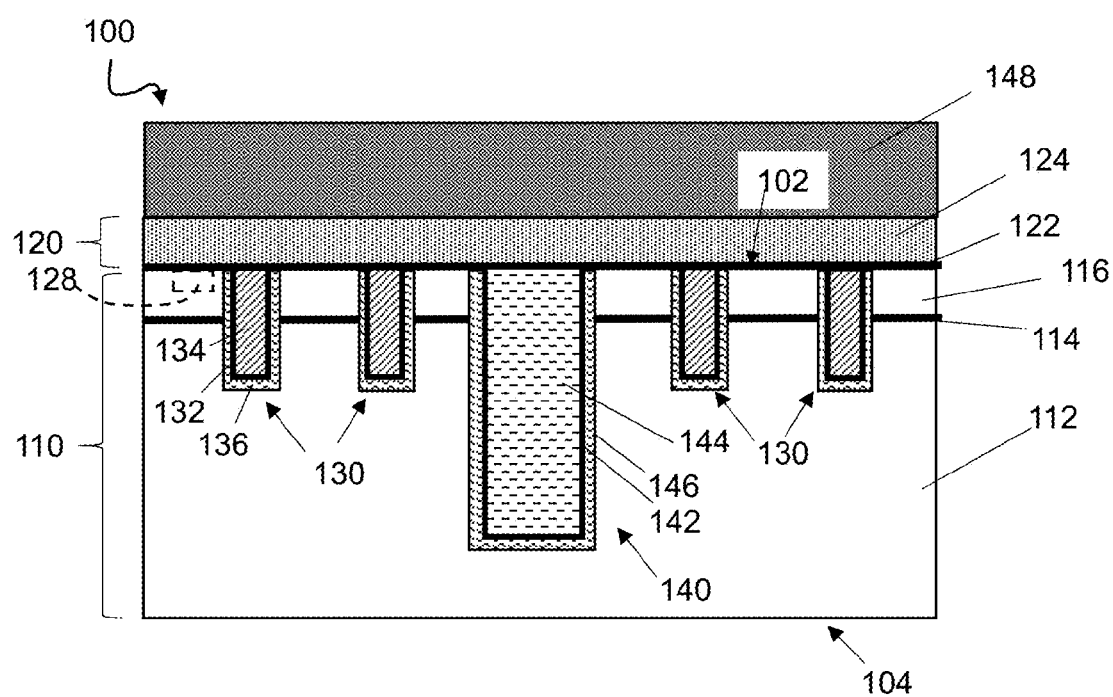

Referring now to FIG. 2, a handle wafer 148 may be formed over front side 102 such that handle wafer 148 covers BEOL region 120 and extends away from back side 104. Handle wafer 148 may be bonded to wafer 100 using standard processes, such as temporary adhesive bonding. As known in the art, handle wafer 148 may include, for example, bulk silicon or glass. Handle wafer 148 provides mechanical support to wafer 100 such that wafer 100 may be manipulated to undergo additional processing.

Figure 3:
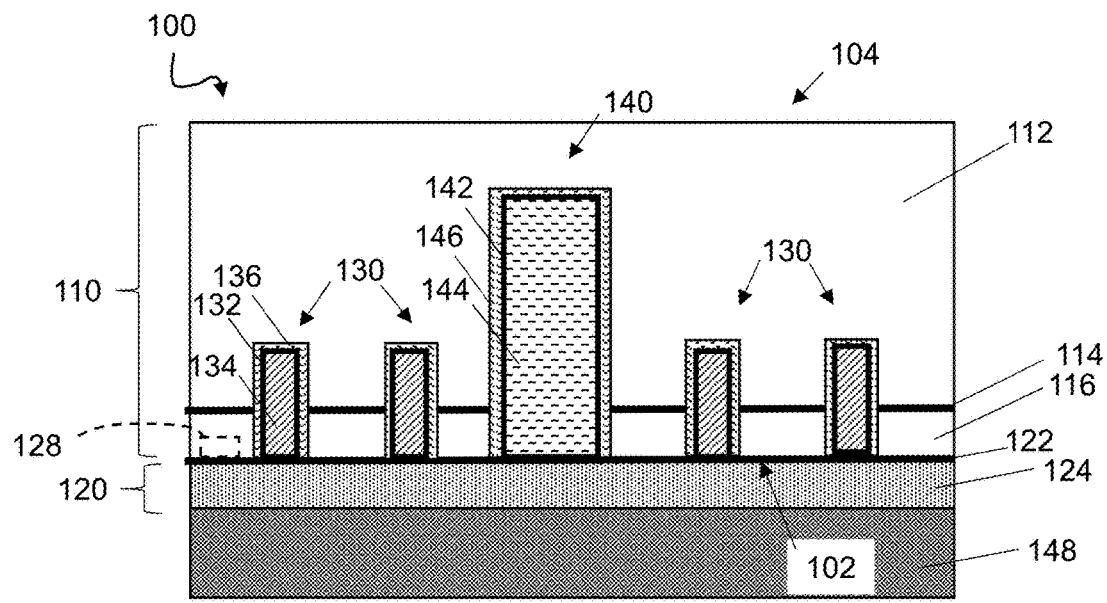
Figure 4:
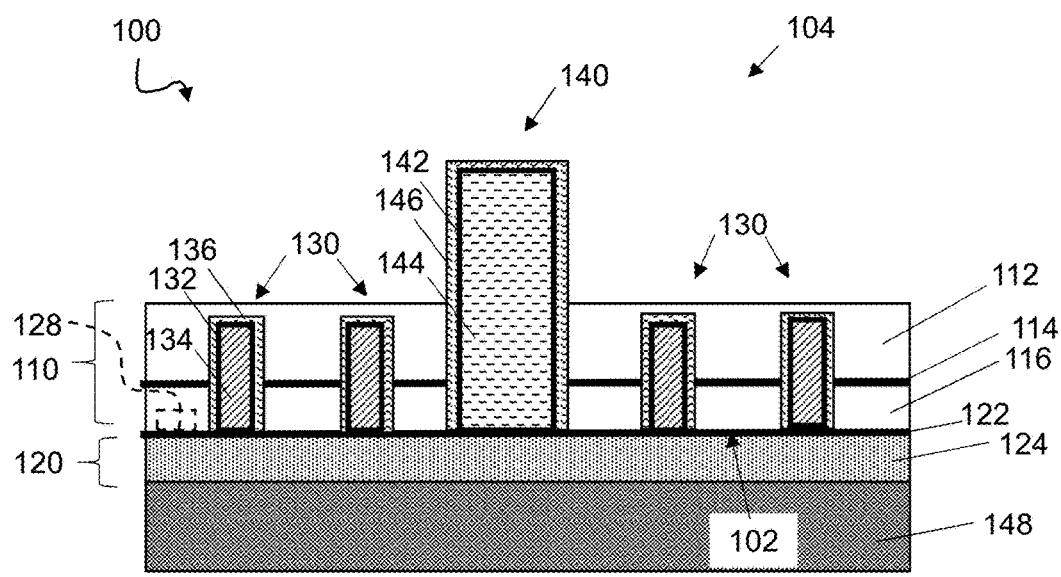
FIGS. 4-8 show cross-sectional views of a wafer undergoing aspects of a method according to an embodiment of the disclosure.

Referring to FIG. 3, wafer 100 may be flipped or turned over such that back side 104 may undergo additional processing. As shown in FIG. 4, substrate 110 may be etched back to expose TSV 140. FIG. 4 shows substrate 110 being etched to just above DT capacitors 130 such that DT capacitors 130 remain encased in or surrounded by substrate 110. However, it is to be understood that substrate 110 may be etched to any desirable depth which may be above the DT capacitor 130 termination or below the DT capacitor 130 termination, without departing from aspects of the disclosure. While many conventional structures utilize thin layers of SOI on the order of approximately 50 nanometers (nm) to approximately 100 nm, embodiments of the disclosure as described herein are not so limited. The RIE process can be selective to semiconductor layer 112 over buried insulator layer 114 by proper parameter selection. For example, sulfur hexafluoride gas can be used to etch semiconductor layer 112 and not aggressively etch buried insulator layer 114. Power and chemistry parameters can be varied to enhance semiconductor layer 112 selectivity versus buried insulator layer 114 selectivity. During RIE, dielectrics or insulators are not etched or may be very minimally etched. This etch process is selective to inorganic materials, such as semiconductor layer 112. In this way, buried insulator layer 114 may act as a natural stop for the etch process thereby protecting semiconductor devices 128. Additionally, since DT capacitors 130 and TSV 140 may include insulating layers 136, 146, DT capacitors 130 and TSV 140 will not be harmed during the etch process. In some embodiments, it may be desirable to etch substrate 110 such that a portion of semiconductor layer 112 remains. In other embodiments, such as with a bulk silicon substrate where a buried insulator layer is not present, substrate 110 may be etched such that a majority of the bulk silicon substrate can be removed. However, in any instance, substrate 110 should not be etched to expose devices 128. That is, substrate 110 should be etched to a thickness that does not cause damage to devices 128. Substrate 110 may be etched to a thickness at just about or above semiconductor devices 128, thereby ensuring that semiconductor devices 128 are not affected during the etch. In some embodiments, a timed etch may be employed such that substrate 110 undergoes etching for a particular duration of time at a particular rate that terminates prior to semiconductor devices 128. The time for the etch may be determined by the etch rate of the material used for substrate, and the desired etch depth, taking into consideration the resistance to etch of the dielectric layers. The percentage of the substrate 110 that surrounds DT capacitors 130 may be determined by a function of DT capacitance requirements versus desired effect of alpha particles and dielectric leakage loss. For maximum capacitance of DT capacitors 130, minimal removal occurs surrounding DT capacitors 130. Thus, DT capacitors 130 may be fully buried in substrate 110.

Figure 5:
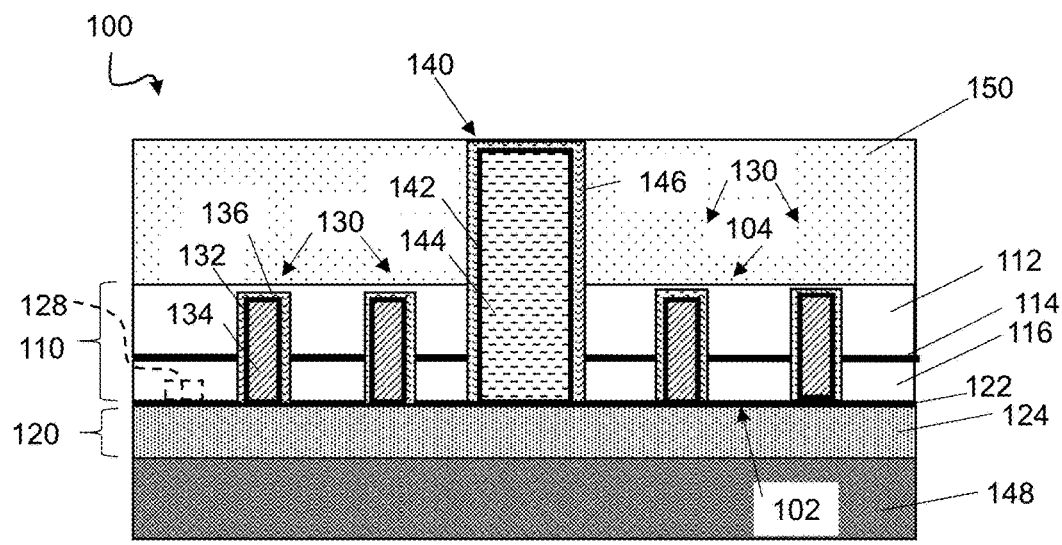

Referring now to FIG. 5, a dielectric layer 150 may be formed, e.g., deposited, over substrate 110, including parts of TSV 140. In other embodiments, dielectric layer 150 may be formed over semiconductor layer 112 where DT capacitors 130 remain encased in substrate 110. Additionally, where DT capacitors 130 are fully exposed, dielectric layer 150 may be formed over buried insulator layer 114. In any embodiment, dielectric layer 150 may be formed on back side 104 extending away from front side 102. Dielectric layer 150 may include polymers and/or organic insulators such as polyimide (such as standard Kapton® or advanced Kapton® available from E. I. du Pont de Nemours and Company), polystyrene, polypropylene, polyethylene, polycarbonate, and/or inorganic materials such as silicon oxide ($SiO_2$) and aluminum oxide ($Al_2O_3$). Other dielectric materials can include, e.g., silicon nitride, fluorinated silicon dioxide (FSG), hydrogenated silicon oxycarbide (SiCOH), porous SiCOH, boro-phospho-silicate glass (BPSG), silsesquioxanes, near frictionless carbon (NFC), carbon doped oxides (i.e., organosilicates) that include atoms of silicon, carbon, oxygen, and/or hydrogen, thermosetting polyarylene ethers, SiLK (a polyarylene ether available from Dow Chemical Corporation), a spin-on silicon-carbon containing polymer material available from JSR Corporation, flex epoxy adhesive, flex acrylic adhesive, Teflon®, other low dielectric constant (<3.9) materials, or layers thereof. Dielectric layer 150 may be formed by chemical or plasma reactions designed to produce the desired material and the process may be designed to produce a layer planar with an upper surface of TSV 140. In some embodiments, dielectric layer 150 may be formed to completely surround TSV 140. Subsequently, dielectric layer 150 may be planarized to a surface of TSV 140 that is farthest from front side 102.

Figure 6:
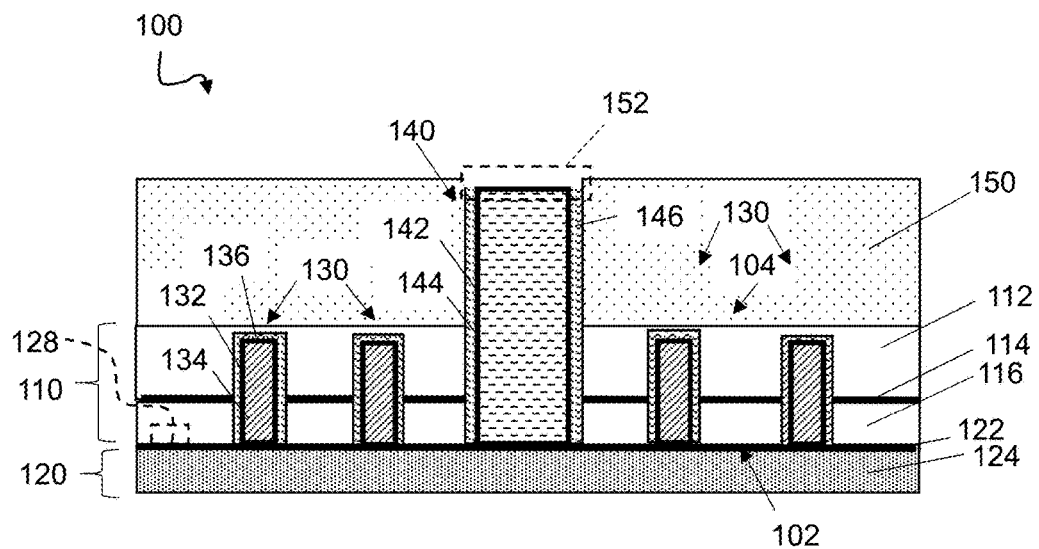

Referring now to FIG. 6, in the case where liner layer 142 is not exposed at a surface of dielectric layer 150 farthest from front side 102, a portion 152 (shown in phantom) of insulating layer 146 may be removed from a surface of TSV 140 that is farthest from front side 102 to expose liner layer 142. That is, portion 152 of insulating layer 146 may be etched to expose liner layer 142 over back side 104. Portion 152 of insulating layer 146 may be removed via a RIE process or a wet etch process that is selective to the insulating layer 146 and leaves dielectric layer 150 substantially unaffected. Additionally, this selective etch process may be performed for a particular duration and rate such that insulator layer 146 on sidewalls of TSV 140 remain substantially unaffected. The duration and rate can be determined based upon the materials that are used for insulating layer 146 and dielectric layer 150 and type of etch process employed. It is understood that other methods such as CMP may also be used to expose a liner layer 142 to give a resultant surface as shown in FIG. 5.

Figure 7:
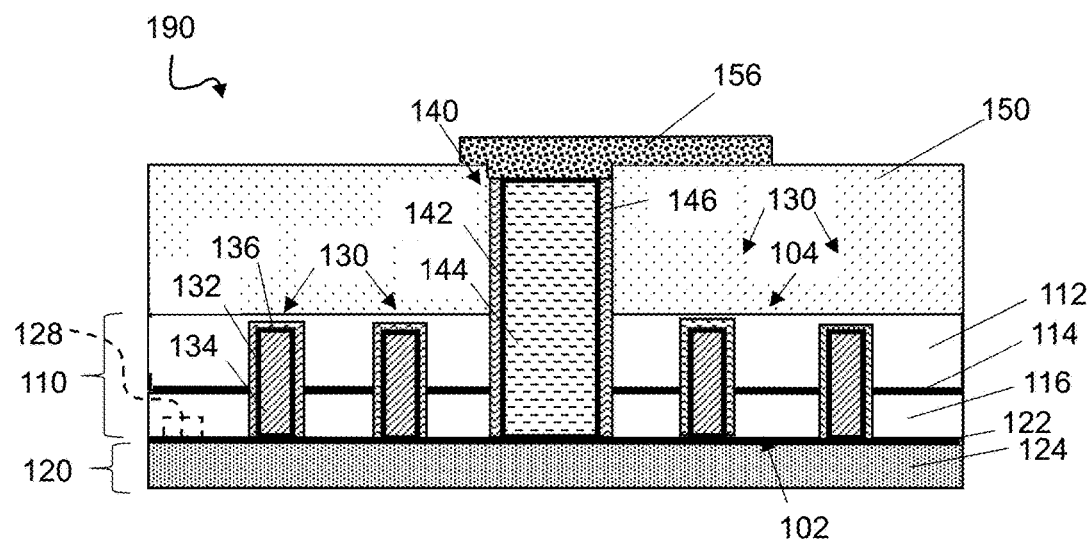

FIG. 7 shows a resulting integrated circuit structure 190, e.g., interposer, after a conductive pad 156 has been formed on back side of wafer 100 (FIG. 6). That is, after portion 152 (FIG. 6) of insulating layer 146 is removed, conductive pad 156 may be formed over TSV 140 such that conductive pad 156 is formed over back side 104 and extends away from front side 102. Conductive pad 156 may be formed via deposition of a liner, e.g., any of the liner layers discussed herein, and a conductor, e.g., copper, patterning of a mask thereover, and etching. Conductive pad 156 may contact liner layer 142 of TSV 140. In this way, appropriate electrical connection is ensured between conductive pad 156 and TSV 140.

Still referring to FIG. 7, resulting integrated circuit structure 190 may include dielectric layer 150 extending from substrate 110 in a direction away from a front side 102. Integrated circuit structure 190 may also include BEOL region 120 extending from substrate 110 in a direction away from a back side 104. At least one DT capacitor 130 may be disposed within substrate 110 and may extend toward BEOL region 120 and toward back side 104. DT capacitors 130 may each be encased by substrate 110 as shown in FIG. 7. However, in other embodiments, DT capacitors may be at least partially disposed within substrate 110 and partially disposed within dielectric layer 150. Further, integrated circuit structure 190 may include TSV 140 adjacent to at least one DT capacitor 130 and extending from BEOL region 120 through dielectric layer 150 and substrate 110 away from front side 102. In other embodiments, TSV 140 may be formed during the formation of BEOL region 120 and may be at least partially disposed within BEOL region 120. Additionally, integrated circuit structure 190 may include a conductive pad 156 over TSV 140 and dielectric layer 150 over back side 104 extending from front side 102. Integrated circuit structure 190 has improved performance in that DT capacitors 130 were fabricated in silicon, e.g., substrate 110, and TSV 140 has increased signal transmission due to being at least partially disposed within dielectric layer 150. That is, signal retention is improved by minimizing the amount of silicon that is surrounding TSV 140.

Figure 8:
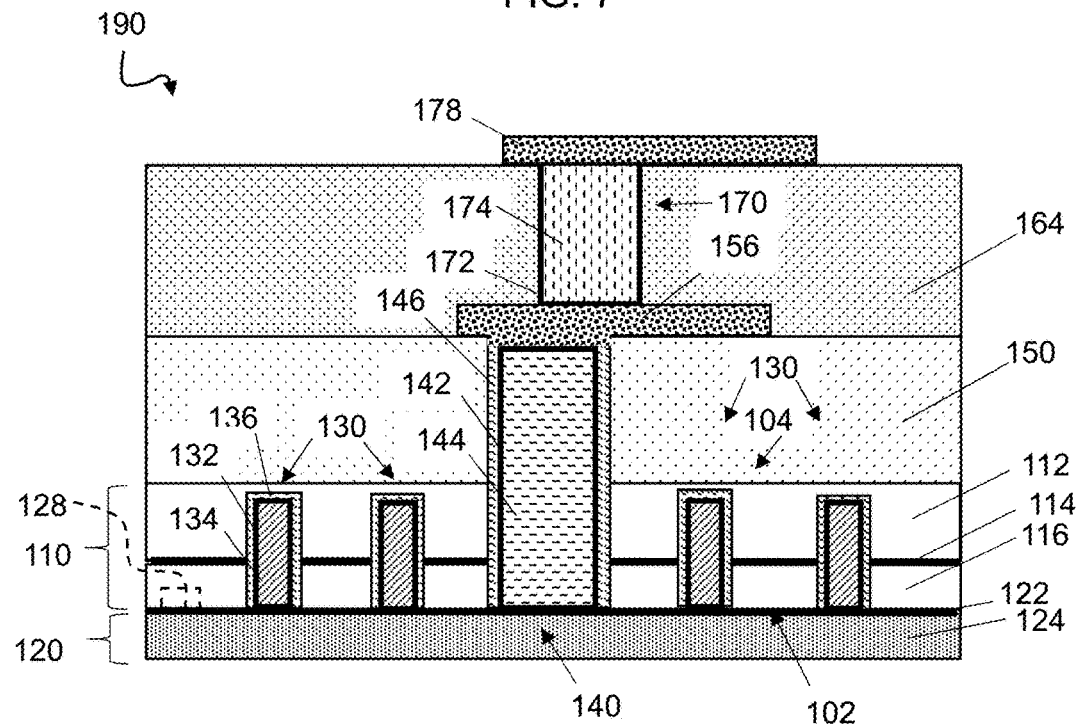

In some embodiments, it may be desirable to include additional wiring levels within integrated circuit structure 190. In those embodiments, another dielectric layer 164 may be formed over conductive pad 156 as shown in FIG. 8. That is, dielectric layer 164 may be formed over back side 104 extending away from front side 102. Dielectric layer 164 may cover conductive pad 156 and at least a portion of dielectric layer 150 over back side 104. Dielectric layer 164 may include any of the dielectric layer materials listed relative to dielectric layer 150 as well as any other dielectric material known in the art. Further, a connection 170 may be formed within dielectric layer 164, e.g., via patterning a mask (not shown), etching a dielectric layer 164, depositing liner layer 172 and conductive metal layer 174, and planarization. Connection 170 may be formed such that it contacts conductive pad 156. Connection 170 may include a liner layer 172 and a conductive metal layer 174. Liner layer 172 may include any of the liner layer materials discussed herein. Metal layer 174 may include any of the conductive metal layer materials discussed herein. Liner layer 172 may be optionally removed or thinned at a surface of connection 170 closest to conductive pad 156 before formation of metal layer 174 to reduce resistivity. Further, another conductive pad 178 similar to conductive pad 156 may be formed over dielectric layer 164 such that it contacts connection 170 and extends away from front side 102. As shown, connection 170 extends from conductive pad 156 toward conductive pad 178 in a direction away from front side 102.

Figure 9:
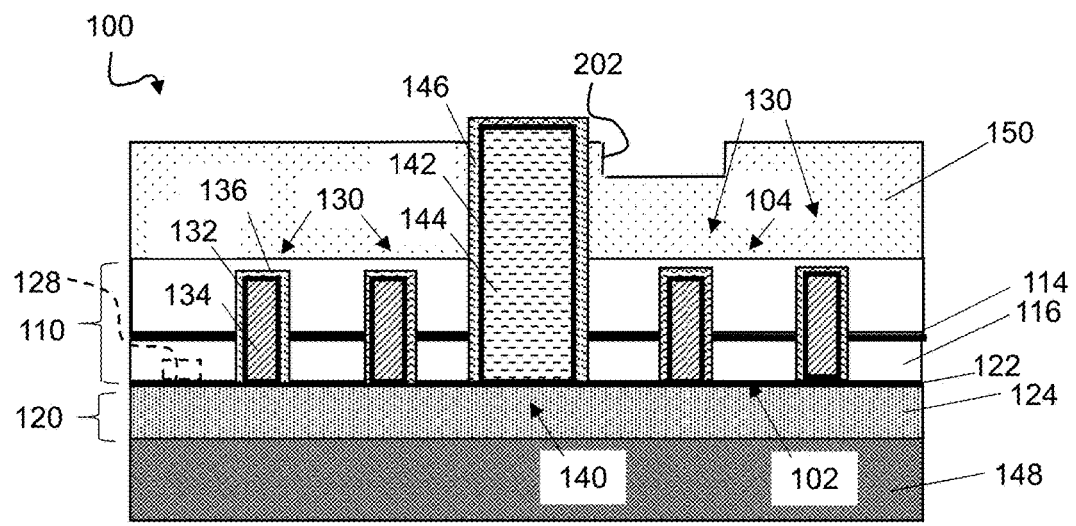
FIGS. 9-15 show cross-sectional views of a wafer undergoing aspects of a method according to other embodiments of the disclosure.

FIGS. 9-15 show integrated circuit structure 100 (FIG. 9) according to another embodiment of the disclosure. In this embodiment, dielectric layer 150 may be formed over TSV 140 and substrate 110 including DT capacitors 130 as described with reference to FIG. 5. However, a wire may be formed within dielectric layer 150. In this embodiment, dielectric layer 150 may be formed by depositing a plurality of layers (not individually shown) and performing a dry or wet surface treatment such as a chemical etch, ash, or plasma in between the deposition of each layer so that the subsequent layer may have greater adhesion to the previous layer. During the formation of the plurality of layers, a wire 220 (FIG. 10) may be formed therein using standard photolithography techniques. Whilst in prior structures, a plurality of layers may have been used to form dielectric layer 150, in the case where wire 220 is include, a minimum of two such layers must be utilized. For example, a mask (not shown) may be formed over one of the layers in the plurality of layers of dielectric layer 150. The mask may be patterned to expose a portion of one of the plurality of layers substantially adjacent to TSV 140. The exposed portion may be etched to form an opening or trench 202 as shown in FIG. 9 and the mask may be removed. In some embodiments (not shown), opening 202 may be formed immediately adjacent to TSV 140 such that electrical connection is provided between the wire that is to be formed within opening 202 and TSV 140. In other embodiments (shown), opening 202 may be formed within dielectric layer 150 such that opening 202 is not immediately adjacent to and is separated from TSV 140. In this embodiment, the wire to be formed within opening 202 will not be directly electrically connected to TSV 140, rather, the wire is connected to TSV 140 via a conductive pad and connection as will be described herein.

Figure 10:
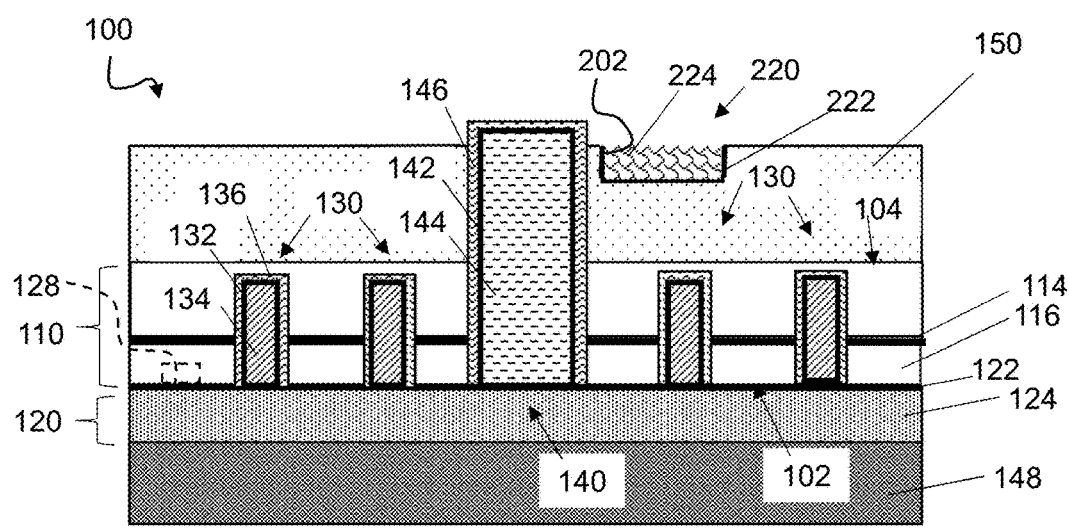
Figure 11:
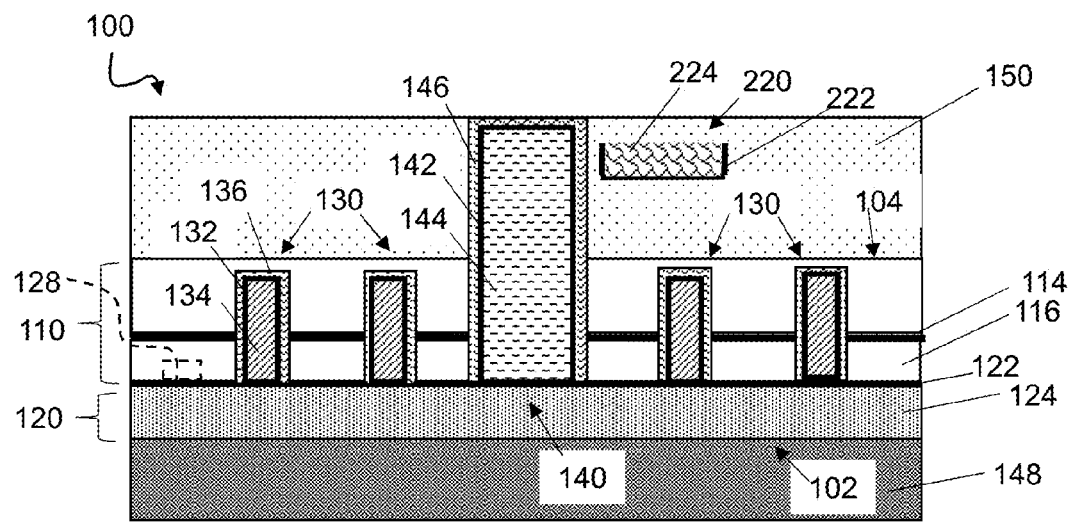

A liner layer 222 may be formed within opening 202 to substantially coat opening 202 as shown in FIG. 10. Subsequently, a metal layer 224 may be formed within opening 202 over liner layer 222 to substantially fill opening 202. Any portion of liner layer 222 and/or metal layer 224 that is disposed outside of opening 202 may be removed via a planarization technique, e.g., CMP. Further, additional layers of dielectric layer 150 may be formed to substantially surround wire 220 as shown in FIG. 11. Dielectric layer 150 may be formed such that it is planar with a surface of TSV 140 farthest from front side 102. In other embodiments, Dielectric layer 150 may be planarized to a surface of TSV 140 that is farthest from front side 102.

Figure 12:
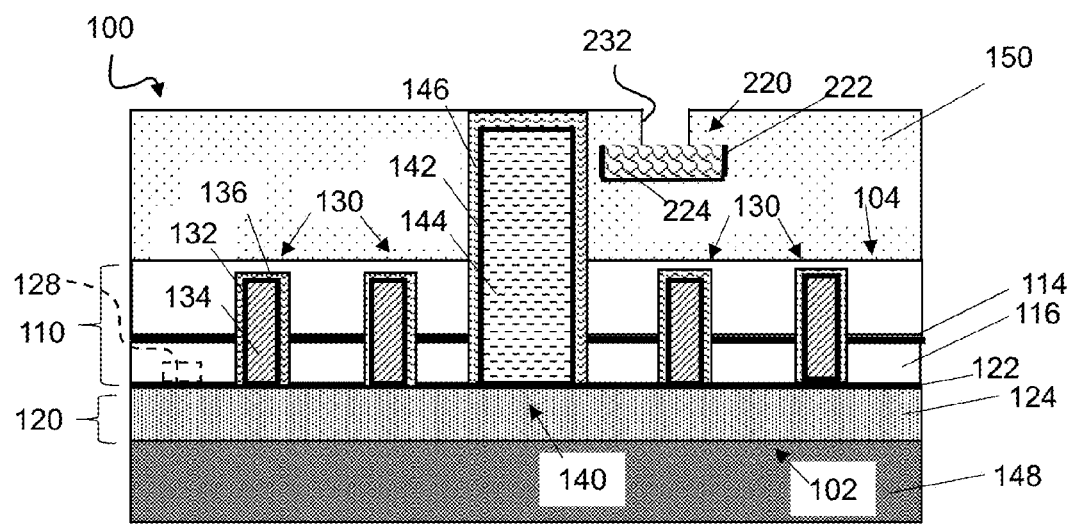
Figure 13:
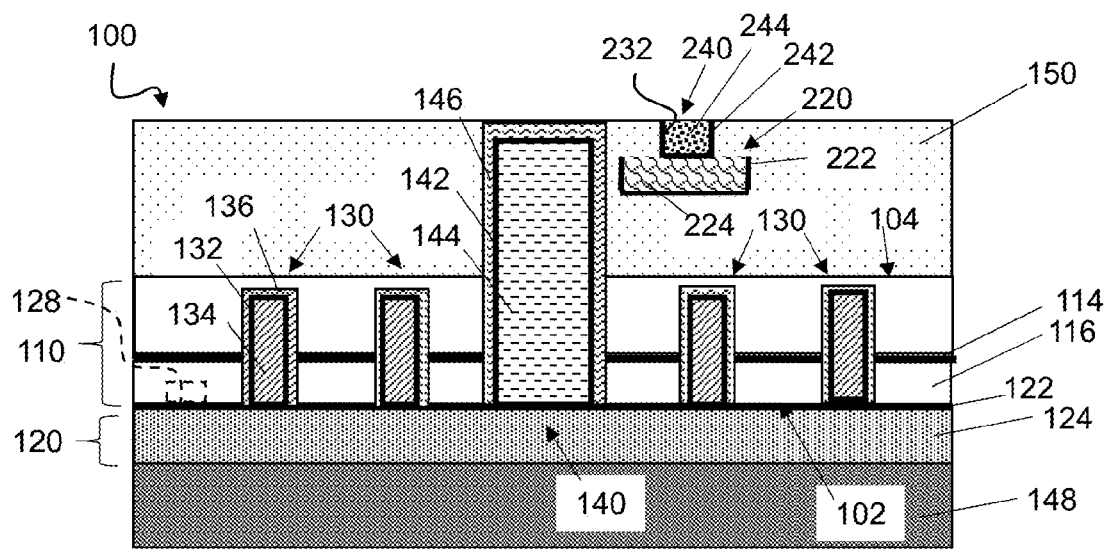
Figure 14:
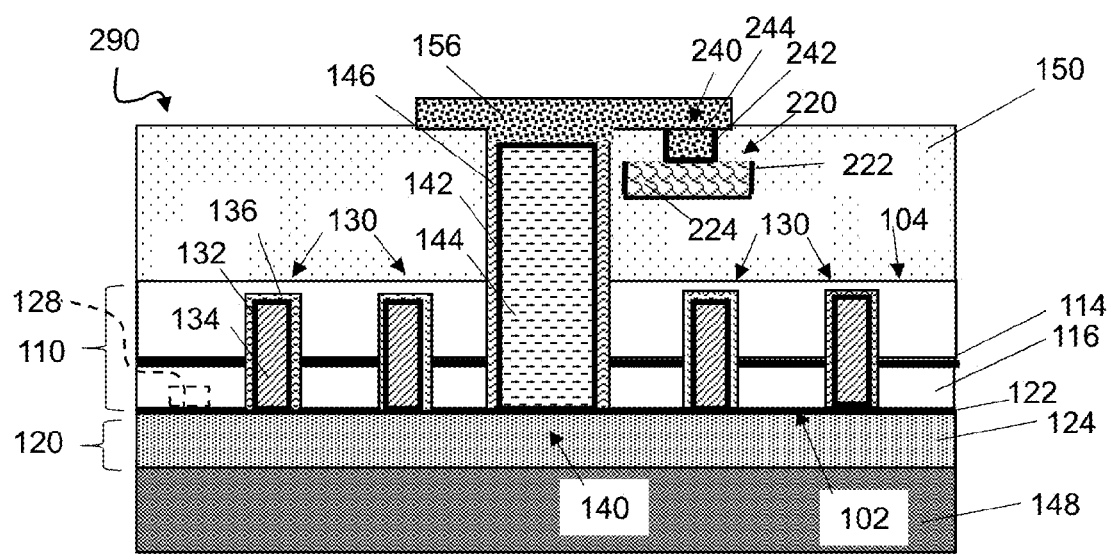

As shown in FIG. 12, another opening 232 may be formed within dielectric layer 150. A mask (not shown) may be formed over the additional layers of dielectric layer 150 and patterned to expose a portion of the additional layers that are directly over wire 220. The additional layers directly over wire 220 may be etched to form opening 232 to expose metal layer 224 of wire 220. A connection 240 may be formed within opening 232 as shown in FIG. 13. Connection 240 may extend from wire 220 and away from front side 102 to a surface of dielectric layer 150 that is farthest from front side 102. Connection 240 may include another liner layer 242 and metal layer 244. Liner layer 242 and metal layer 244 of connection 240 may include any of the materials listed herein for liner layers or conductive metal layers. Connection 240 may be formed such that it is in electrical contact with wire 220. That is, liner layer 242 may be formed, e.g., deposited, to substantially coat opening 232 such that liner layer 242 is in contact with wire 220, e.g., metal layer 224 of wire 220. Additionally, metal layer 244 may be formed, e.g., deposited, over liner layer 242 to substantially fill opening 232. Any portion of liner layer 242 and/or metal layer 244 that is disposed outside of opening 232 may be removed via a planarization technique, e.g., CMP. After connection 240 is formed such that it is in electrical connection with wire 220, conductive pad 156 may be formed as described with respect to FIGS. 6-7 as shown in FIG. 14 to form a resulting integrated circuit structure 290, e.g. an interposer. However, in this embodiment, conductive pad 156 may be formed such that it is in electrical connection with both TSV 140 and connection 240. That is, conductive pad 156 and connection 240 provide electrical connection between wire 220 and TSV 140. Conductive pad 156 may be formed over TSV 140, connection 240 and at least a portion of dielectric layer 150 over back side 104. In another embodiment (not shown), opening 232 may be formed and then filled with liner layer 242 and metal layer 244 at the same time that conductive pad 156 is formed such that conductive pad 156 and connection 240 include the same materials.

Figure 15:
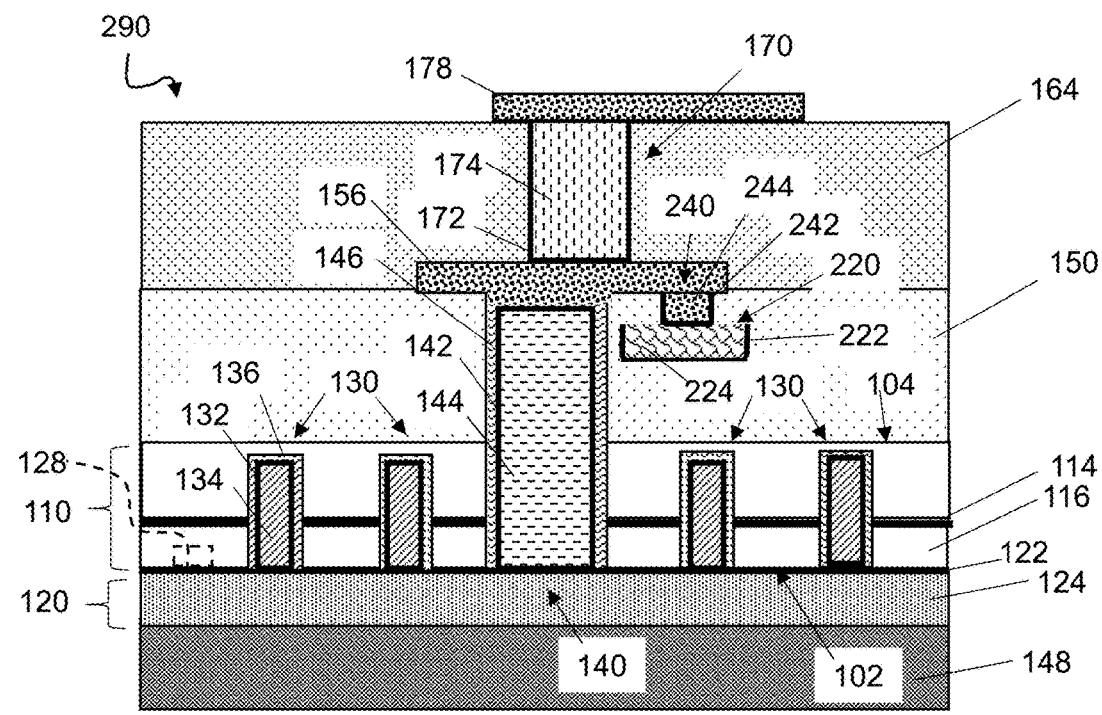

FIG. 15 shows resulting integrated circuit structure 290 according this embodiment of the disclosure. As shown, additional wiring levels may be formed over conductive pad 156 over back side 104 as discussed with reference to FIG. 8. That is, dielectric layer 164 may be formed over conductive pad 156. Additionally, connection 170 may be formed within dielectric layer 164, e.g., via patterning, etching, deposition of liner layer 172 and conductive metal 174, and planarization. Connection 170 may be formed such that it contacts conductive pad 156. Further, another conductive pad 178 may be formed over dielectric layer 164 such that it contacts connection 170. As shown, connection 170 extends from conductive pad 162 toward conductive pad 178 in a direction away from front side 102. Integrated circuit structure 290 has improved performance in that DT capacitors 130 were fabricated in silicon, e.g., substrate 110, and TSV 140 has increased signal transmission due to being at least partially disposed within dielectric layer 150. Additionally, this embodiment allows for additional wiring, e.g., wire 220, to be formed adjacent to and electrically connected to TSV 140 during formation of dielectric layer 150 resulting in finer wiring.

Figure 16:
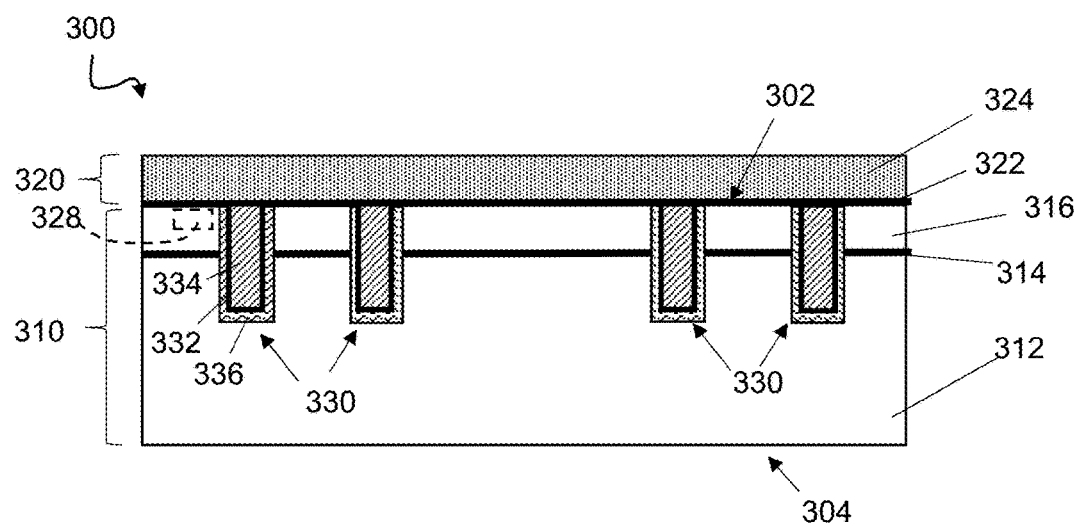
FIGS. 16-25 show cross-sectional views of a wafer undergoing aspects of a method according to other embodiments of the disclosure.

FIGS. 16-25 show another embodiment of the disclosure. In this embodiment, a TSV is constructed from a back side of a substrate. The opening for the TSV may be formed by two etch process that may allow for improved taper control. FIG. 16 shows a cross-sectional view of a preliminary wafer 300, e.g., a passive silicon interposer. Wafer 300 may include a substrate 310 having a front side 302 and a back side 304. Substrate 310 may include a semiconductor layer 312. Overlying semiconductor layer 312 may be a buried insulator layer 314, and overlying buried insulator layer 314 may be a SOI layer 316. Semiconductor layer 312, buried insulator layer 314, and SOI layer 316 may include any of the materials discussed herein relative to semiconductor layer 112, buried insulator layer 114, and SOI layer 116 (FIG. 1), respectively. However, in other embodiments, (not shown) substrate 310 may include a bulk silicon substrate.

Wafer 300 may also include a back-end-of-the-line (BEOL) region 320 over front side 302. BEOL region 320 may include a transition region 322 extending from SOI layer 316 away from back side 304 and a BEOL region 124 extending from transition region 322 and extending away from back side 304. BEOL region 320 may include any of the materials and structures listed with respect to BEOL region 120 (FIG. 1). Wafer 300 may include other integrated circuit devices 328 (shown in phantom), or portions thereof, such as but not limited to: transistors, resistors, and interconnects, etc., within SOI layer 316. BEOL processing includes the series of processes in which wiring is formed to connect to the semiconductor devices formed during front-end-of-line (FEOL) processing. BEOL processing generally begins when the first layer of metal wiring is formed on the wafer.

Wafer 300 may also include passive devices such as at least one deep trench (DT) capacitors 330. DT capacitors 330 may be disposed within front side 102 and extend toward back side 2014. In some embodiments, DT capacitors 330 may contact BEOL region 320. DT capacitors 330 may include a liner layer 332 and an inner conductor layer 334 substantially surrounded by liner layer 332. DT capacitors 330 may include insulating layer 336. Insulating layer 336 may be formed, e.g., deposited, within the trench openings to substantially line the trench openings prior to the formation of liner layer 332. Insulating layer 336, liner layer 332 and inner conductor 334 may be planarized to a top surface of SOI layer 316. Liner layer 332, inner conductor layer 334, and insulating layer 336 may include any of the materials discussed herein relative to liner layer 132, inner conductor layer 134, and insulating layer 136 (FIG. 1), respectively. Wafer 300 may be formed as described herein relative to FIG. 1. However, the processes described with reference to FIG. 1 relative to TSV 140 may not be included in this embodiment. As will be described herein, a TSV may be formed at a later time according to the process of this embodiment.

Figure 17:
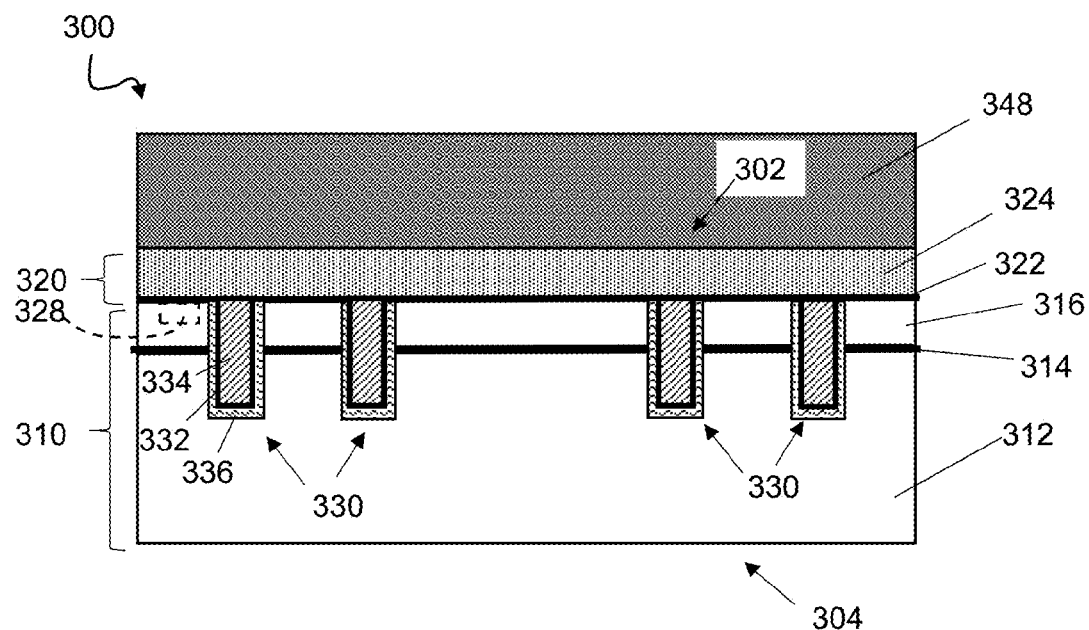

Referring now to FIG. 17, a handle wafer 348 may be formed on front side 302 such that handle wafer 348 covers BEOL region 320 and extends away from back side 304. Handle wafer 348 may be bonded to wafer 300 using standard processes, such as temporary adhesive bonding. As known in the art, handle wafer 348 may include, for example, bulk silicon or glass. Handle wafer 348 provides mechanical support to wafer 300 such that wafer 300 may be manipulated to undergo additional processing.

Figure 18:
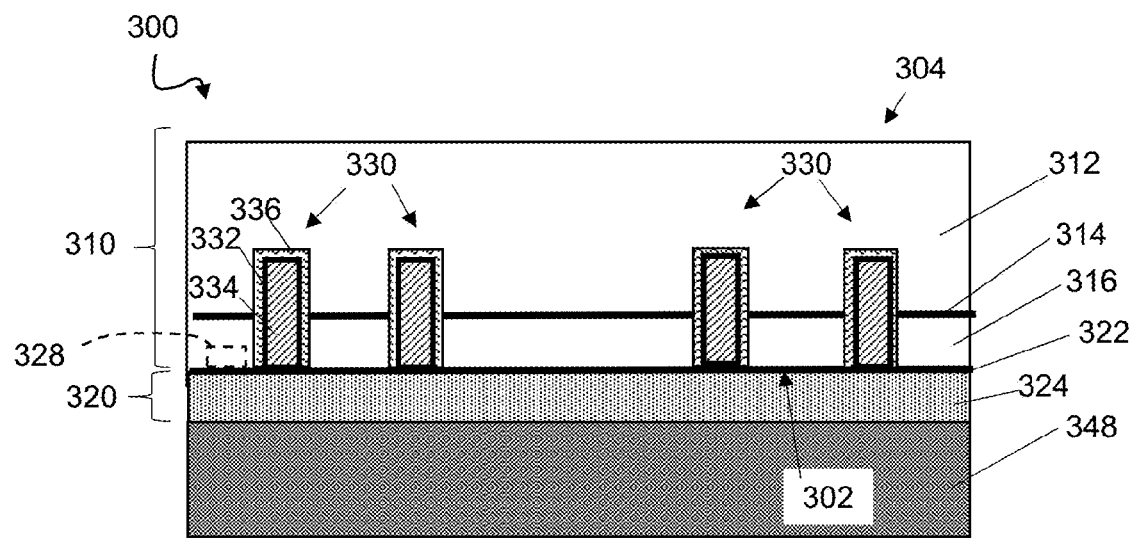
Figure 19:
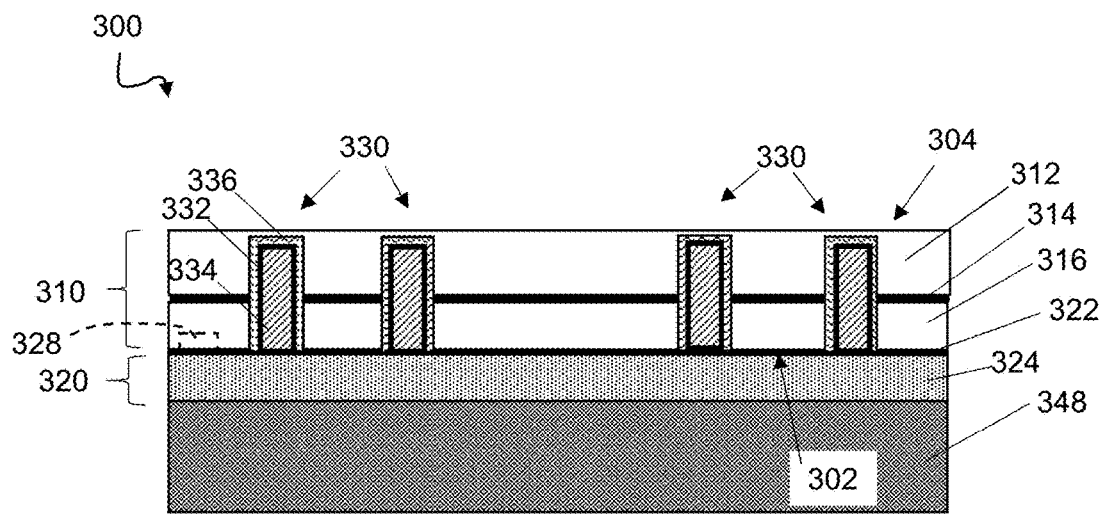

Referring to FIG. 18, wafer 300 may be flipped or turned over such that back side 304 may undergo additional processing. As shown in FIG. 19, substrate 310 may be etched back to just above DT capacitors 330 such that DT capacitors 330 remain encased in or surrounded by substrate 310. However, it is to be understood that substrate 310 may be etched to any desirable depth without departing from aspects of the disclosure. In some embodiments, substrate 310 may be etched to buried insulator layer 314. In this embodiment, a RIE process may be employed. The RIE process can be selective to semiconductor layer 312 over buried insulator layer 314 by proper parameter selection. For example, sulfur hexafluoride gas can be used to etch semiconductor layer 312 and not aggressively etch buried insulator layer 314. Power and chemistry parameters can be varied to enhance semiconductor layer 312 selectivity versus buried insulator layer 314 selectivity. During this RIE, dielectrics or insulators are not etched or are very minimally etched. The etch process is selective to specific inorganic materials, such as semiconductor layer 312. In this way, buried insulator 314 may act as a natural stop for the etch process thereby protecting semiconductor devices 328. Additionally, since DT capacitors 330 includes insulating layer 336, DT capacitors 330 will not be harmed during the etch process. In other embodiments, such as where substrate 310 includes a bulk silicon substrate and a buried insulator layer is not present, substrate 310 may be etched such that a majority of the bulk silicon substrate can be removed. However, in any instance, substrate 310 should not be etched to expose devices 328. That is, substrate 310 should be etched to a thickness that does not cause damage to devices 328. Substrate 310 may be etched to a thickness at just about or above semiconductor devices 328 thereby ensuring that semiconductor devices 328 are not affected during the etch. In some embodiments, a timed etch may be employed such that substrate 310 undergoes etching for a particular duration of time at a particular rate that terminates prior to semiconductor devices 328. The percentage of the substrate 310 that surrounds DT capacitors 330 that is removed may be determined by the desired performance of DT capacitance requirements versus effect of alpha particles and dielectric leakage loss. For maximum capacitance of DT capacitors 330, minimal removal occurs surrounding DT capacitors 330. Thus, DT capacitors 330 may be fully buried in substrate 310.

Figure 20:
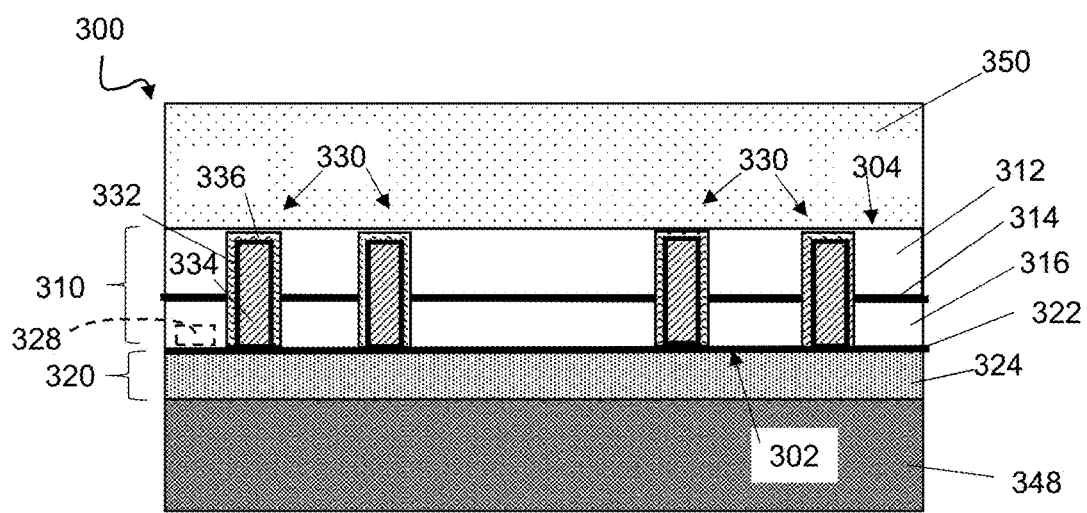

Referring now to FIG. 20, a dielectric layer 350 may be formed, e.g., deposited, over substrate 310. In other embodiments, dielectric layer 350 may be formed over semiconductor layer 312 where DT capacitors 330 remain encased in substrate 310. Additionally, where DT capacitors 330 are exposed up to the buried insulator layer 314, dielectric layer 350 may be formed over 314. In any embodiment, dielectric layer 350 may be formed over back side 304 extending away from front side 102. Dielectric layer 350 may include any of the materials discussed herein relative to dielectric layer 150 (FIG. 5).

Figure 21:
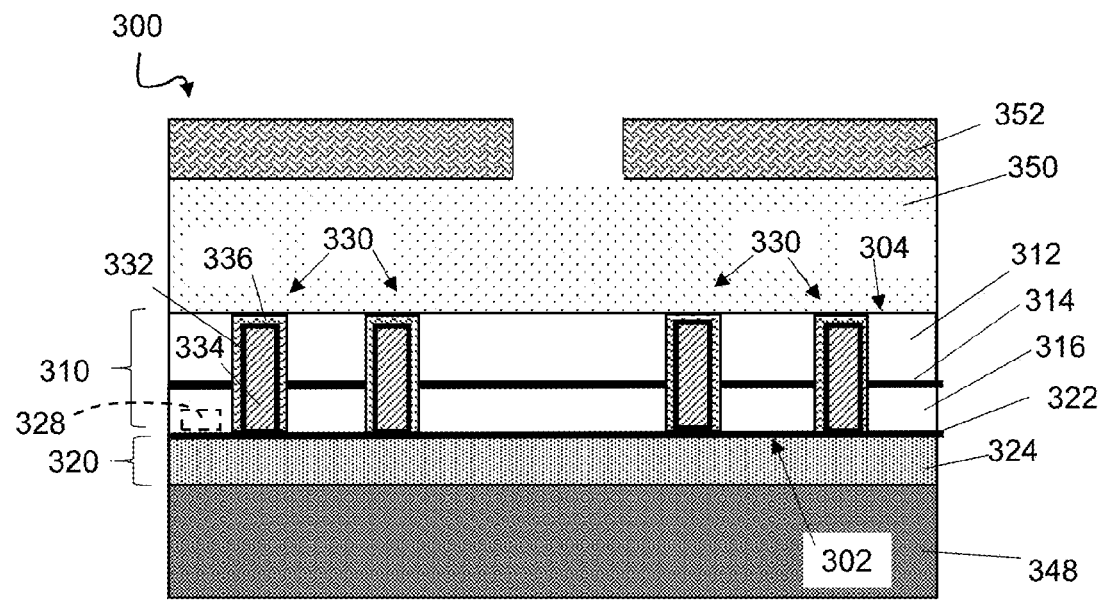
Figure 22:
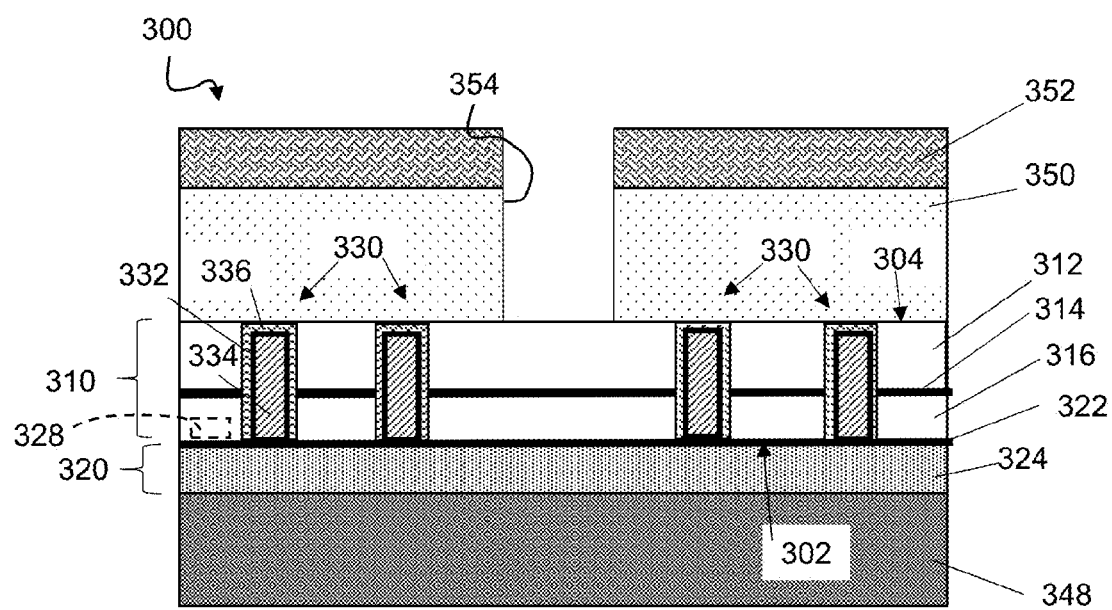
Figure 23:
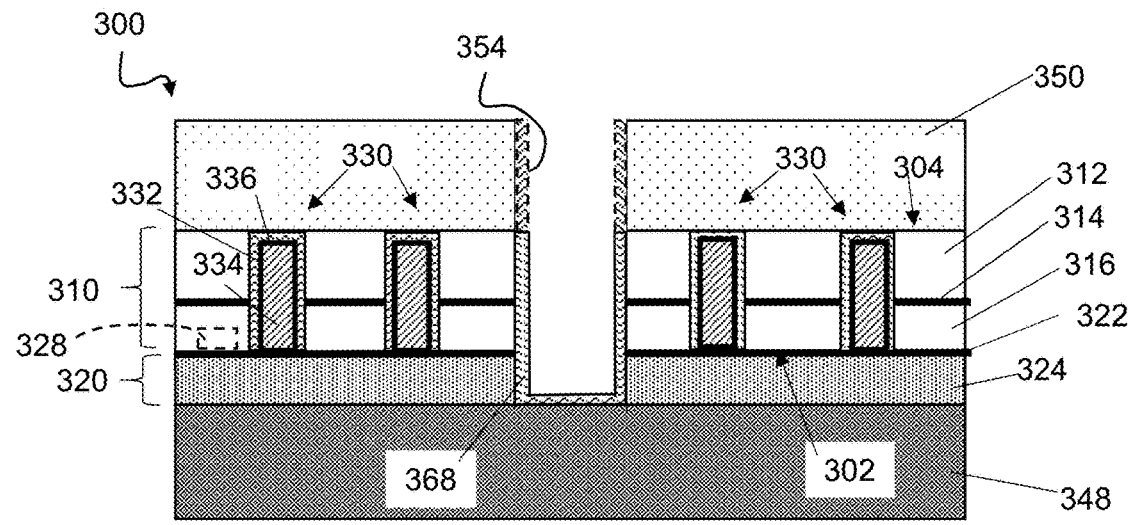

Referring now to FIG. 21, a mask 352 may be formed over dielectric layer 350 on back side 304 extending away from front side 302. The materials for mask 352 are selected based on requirements such as opacity to the laser wavelength used, and selectivity to the etches used. Mask 352 may be patterned and etched to expose dielectric layer 350 to facilitate the formation of an opening 354 within dielectric layer 350 as shown in FIG. 22. After dielectric layer 350 is exposed, opening 354 may be formed within dielectric layer 350. Opening 354 may be formed, for example, via etching, such as RIE or laser ablation, of the dielectric layer 350 to expose substrate 310, e.g., semiconductor layer 312. As shown in FIG. 23, another etch, such as a deep RIE, e.g., a Bosch etch, may be employed to remove portions of substrate 310 and BEOL region 320 to expose handle wafer 348. Deep RIE etching may include a pulsed or time-multiplexed etching. During a deep RIE etch, a mode of an isotropic etch is alternated with a deposition of a chemically inert passivation layer (not shown). In this etch process, mask 352 (FIG. 22) may be eroded or fully removed, and dielectric layer 350 acts as an additional mask during the etching of substrate 310 and BEOL region 320. Additionally, after this second etch process (the deep RIE), the chemically inert passivation layer may be removed and an insulating layer 368 may be formed, e.g., deposited, in opening 354 from dielectric layer 350 to handle wafer 348. However, while shown and described as being deposited form dielectric layer 350 to handle wafer 348, insulating layer 368 may extend from handle wafer 348 to a surface of dielectric layer 350 that is farthest from handle wafer 348 as shown in phantom in other embodiments. That is, insulating layer 368 may extend along a vertical length of opening 354. Insulating layer 368 may include any insulating material discussed herein. At the conclusion of the etch process, any remaining mask 352 (FIG. 22) may be removed.

Figure 24:
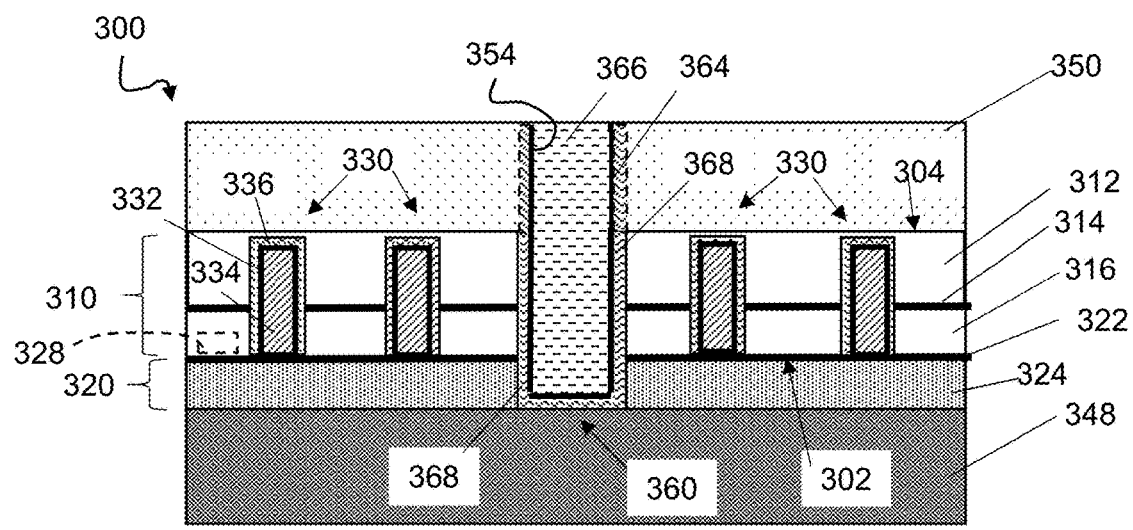

As shown in FIG. 24, a TSV 360 may be formed within opening 354. TSV 360 may include a liner layer 364 and a conductive metal layer 366. That is, opening 354 may be substantially lined or coated with liner layer 364. Further, a metal layer 366 may be formed within opening 354 over liner layer 364 to substantially fill opening 354. Liner layer 364 and metal layer 366 may include any of the materials discussed herein relative to liner layer 142 and metal layer 144 (FIG. 1), respectively. Insulating layer 368 may be required as an insulating layer between metal 366 and the silicon substrate 312, whereas no such insulating layer is needed in the region of dielectric layer 350, because dielectric layer 350 is not electrically conducting. After metal layer 366 is formed, metal layer 366, liner layer 364, and insulating layer 368 may be planarized to an upper surface of dielectric 350, after removal of any remaining mask.

Figure 25:
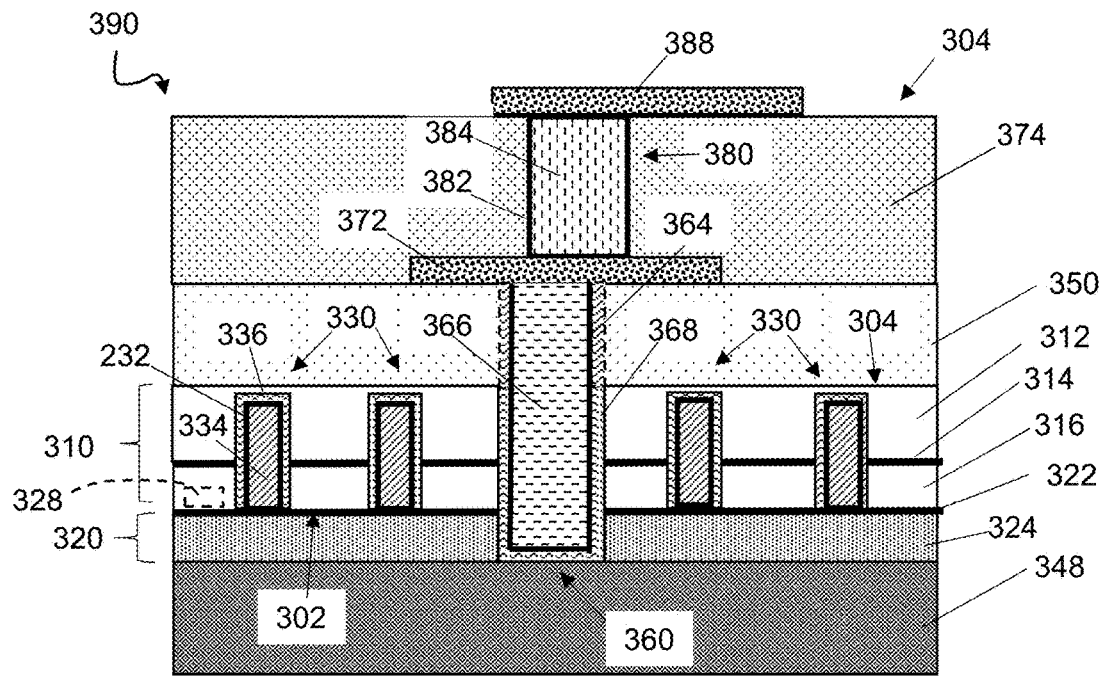

FIG. 25 shows a resulting integrated circuit structure 390, e.g., interposer, according to this embodiment of the disclosure. As shown in FIG. 25, conductive pad 372 may be formed as described with reference to FIG. 7. In this embodiment, conductive metal 366 and liner layer 364 are already exposed. Therefore, there is no need to remove any portion of insulating layer 368 as was discussed relative to FIG. 6. Further, additional wiring levels may be formed over conductive pad 372 on back side 304 as discussed with reference to FIG. 8. That is, dielectric layer 374 may be formed over conductive pad 372. Additionally, connection 380 may be formed within dielectric layer 374, e.g., via patterning a mask (not shown), etching dielectric layer 374, depositing liner layer 382 and metal layer 384, and planarizing liner layer 382 and conductive metal 384. Connection 380 may be formed such that it contacts conductive pad 372. Further, another conductive pad 388 may be formed over dielectric layer 374 such that it contacts connection 380. As shown, connection 380 extends from conductive pad 372 toward conductive pad 388 in a direction away from front side 302. Liner layer 382 may include any of the liner layer materials discussed herein. Metal 384 may include any of the conductive metal layer materials discussed herein.

Figure 26:
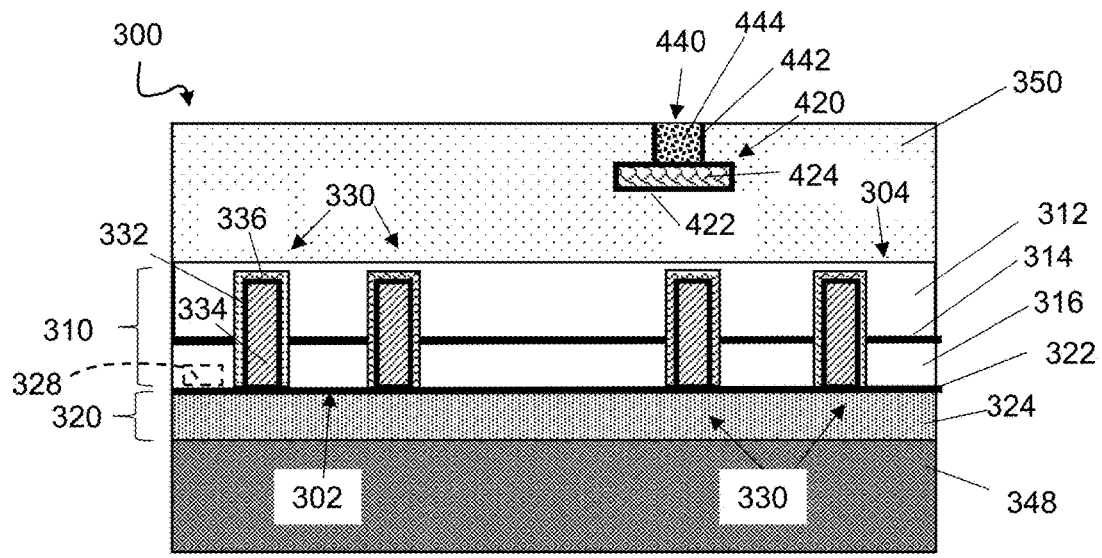
FIGS. 26-31 show cross-sectional views of a wafer undergoing aspects of a method according to other embodiments of the disclosure.

FIGS. 26-31 show wafer 300 undergoing processes according to another embodiment of the disclosure. As shown in FIG. 26, during formation of dielectric layer 350, a wire 420 may be formed within dielectric layer 350. For example, dielectric layer 350 may be formed by depositing a plurality of layers (not shown) and a dry or wet surface treatment, such as a chemical etch, ash, or plasma, may be performed in between each layer so that the subsequent layer may have greater adhesion to the previous layer. During the formation of the plurality of layers, wire 420 may be formed therein using standard photolithography techniques. For example, wire 420 may be formed described with respect to wire 220 shown in FIGS. 9-11. As discussed herein with respect to wire 220, wire 420 may include a liner layer 422 and a metal layer 424. Still referring to FIG. 26, a connection 440 may be formed as described with respect to connection 240 shown in FIGS. 12-14. As with connection 240, connection 440 may include a liner layer 442 and a metal layer 444. Liner layers 422, 442 and metal layers 424, 444 may include any liner layer and metal layer materials discussed herein.

Figure 27:
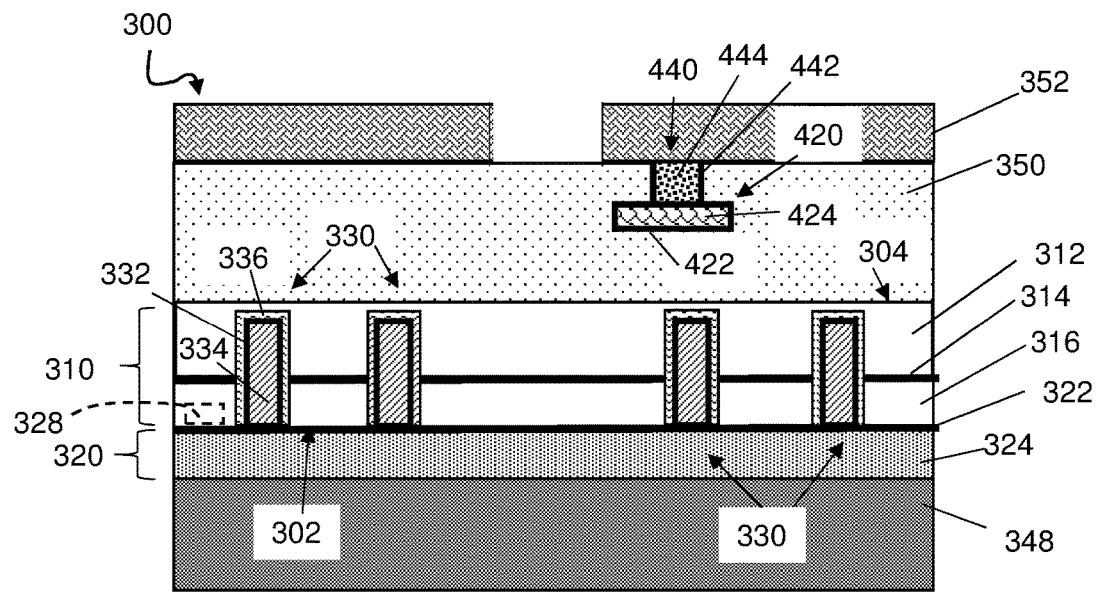
Figure 28:
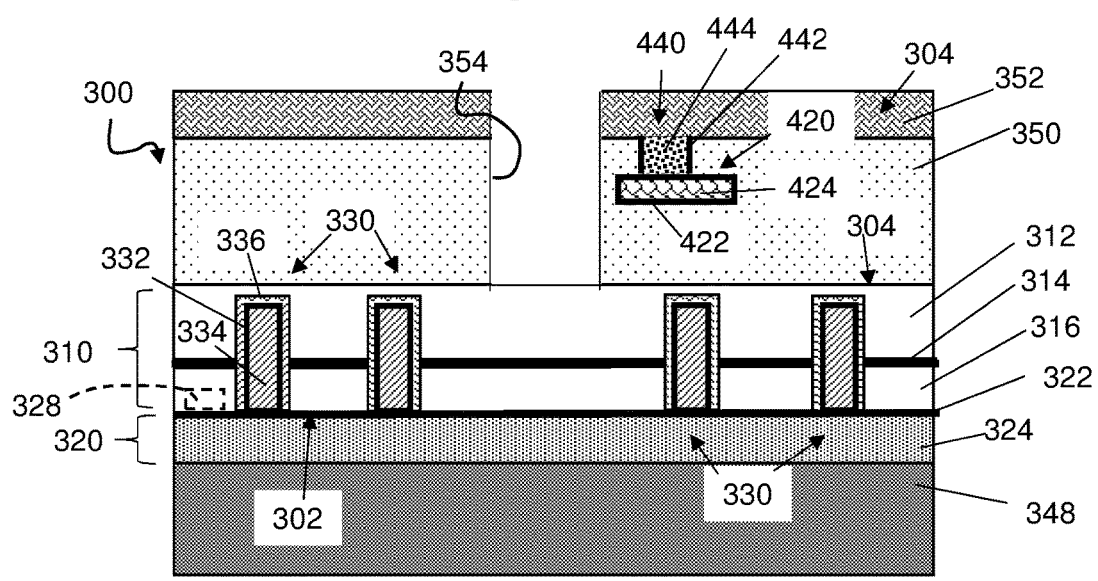
Figure 29:
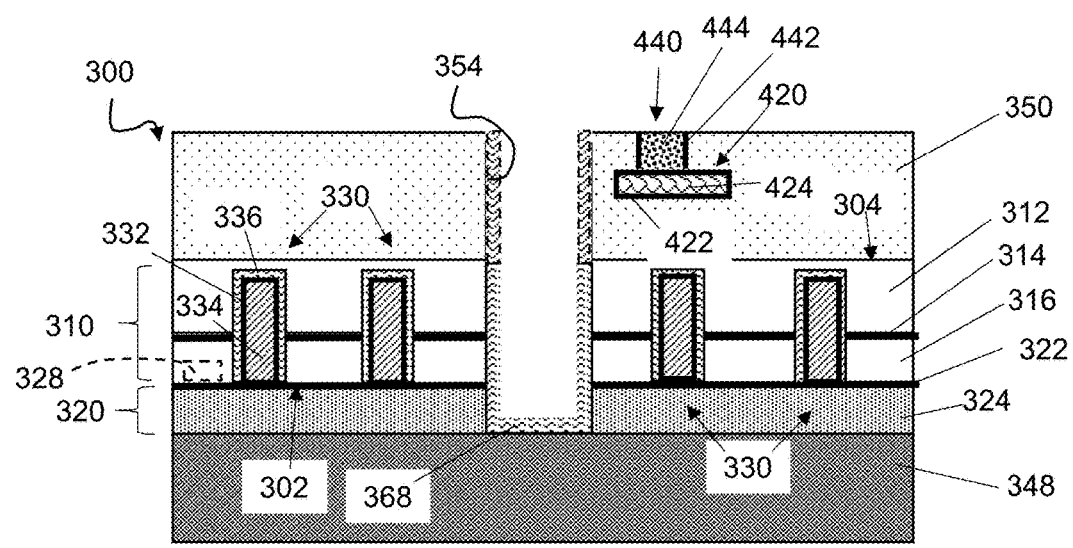

Referring now to FIG. 27, mask 352 may be formed to cover dielectric layer 350 on back side 304 as described with reference to FIG. 21. Mask 352 may be patterned and etched to expose dielectric layer 350 to facilitate the formation of opening 354 within dielectric layer 350 as shown in FIG. 28. After dielectric layer 350 is exposed, opening 354 may be formed within dielectric layer 350. Opening 354 may be formed, for example, via etching or laser ablation of dielectric layer 350 to expose semiconductor layer 312. As shown in FIG. 29, another etch, such as a deep RIE, e.g., a Bosch etch, may be employed to remove portions of substrate 310 and BEOL region 320 to expose handle wafer 348. Deep RIE etching is also known as a pulsed or time-multiplexed etching. During a deep RIE etch, a mode of an isotropic etch is alternated with a deposition of a chemically inert passivation layer (not shown). In this etch process, mask 352 (FIG. 28) may be eroded or fully removed, and dielectric layer 350 may act as a mask during the etching of substrate 310 and BEOL region 320. Additionally, after this second etch process, the chemically inert passivation layer may be removed and insulating layer 368 may be formed, e.g., deposited, in opening 354 from dielectric layer 350 to handle wafer 348. However, while shown and described as being deposited form dielectric layer 350 to handle wafer 348, insulating layer 368 may extend from handle wafer 348 to a surface of dielectric layer 350 that is farthest from handle wafer 348 as shown in phantom in other embodiments. That is, insulating layer 368 may extend along a vertical length of opening 354. Insulating layer 368 may include any insulating material discussed herein. At the conclusion of the etch process, any remaining mask 352 (FIG. 28) may be removed.

Figure 30:
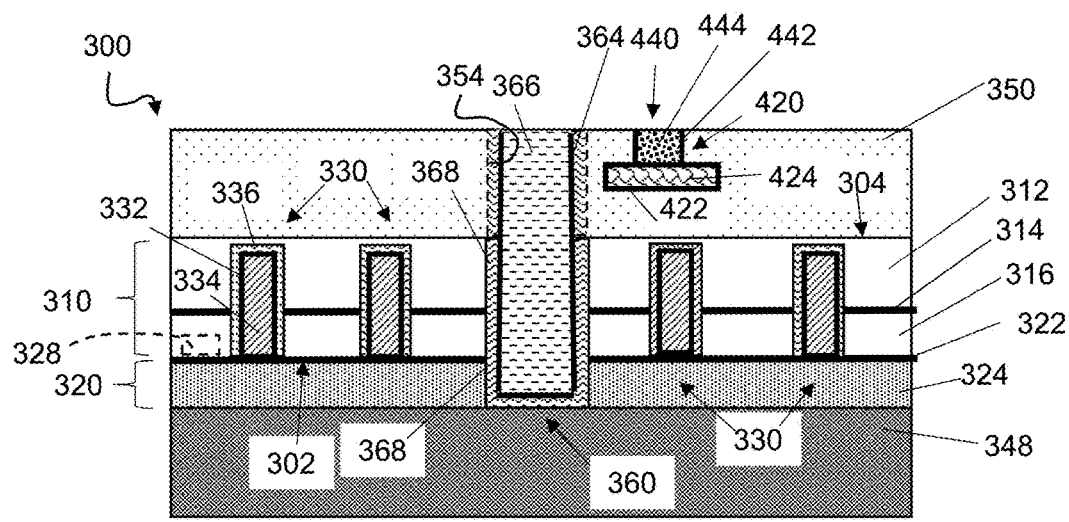

As shown in FIG. 30, a TSV 360 may be formed within opening 354 as described with respect to FIG. 24. TSV 360 may include a liner layer 364 and a conductive metal 366 layer. That is, opening 354 may be substantially lined or coated with liner layer 364. Further, metal layer 366 may be formed within opening 354 over liner layer 364 to substantially fill opening 354. Liner layer 364, metal layer 366, and insulating layer 368 may include any of the materials discussed herein relative to liner layer 142, metal layers 144, and insulating layer 146 (FIG. 1), respectively. After, metal layer 366 is formed, metal layer 366, liner layer 364, and insulating layer 368 may be planarized to an upper surface of dielectric layer 350.

Figure 31:
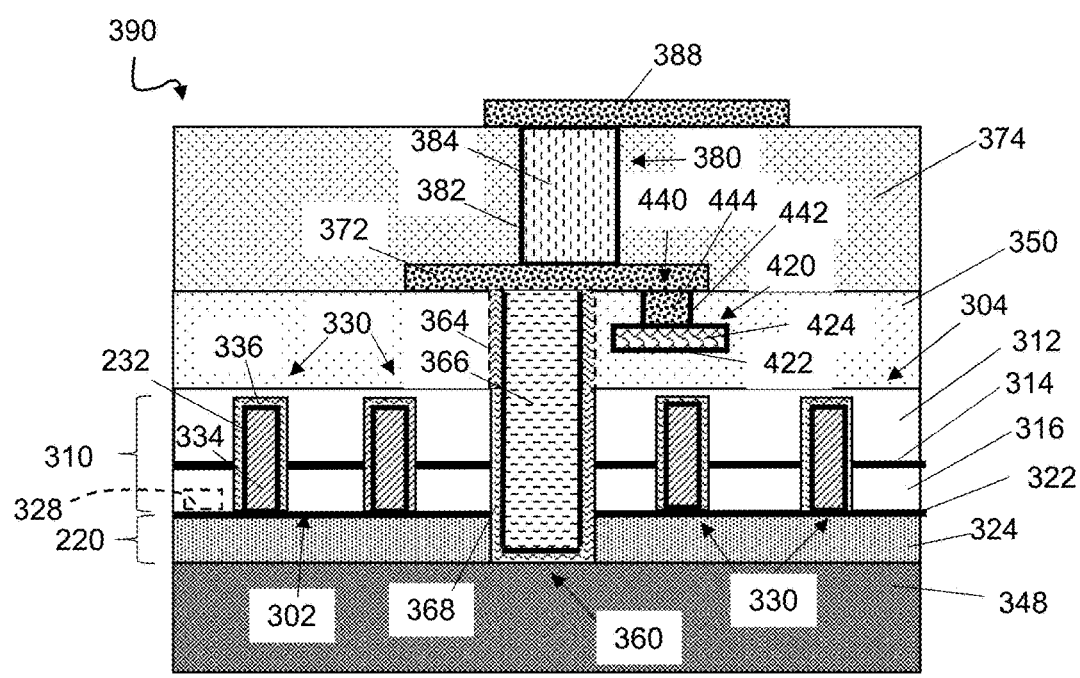

FIG. 31 shows a resulting integrated circuit structure 390, e.g., interposer, according to this embodiment of the disclosure. As shown in FIG. 31, conductive pad 372 may be formed as described with reference to FIG. 7. In this embodiment, metal layer 366 and liner layer 364 are already exposed. Therefore, there is no need to remove any portion of insulating layer 368 as was discussed relative to FIG. 6. Further, additional wiring levels may be formed over conductive pad 372 on back side 304 as discussed with reference to FIG. 7. That is, dielectric layer 374 may be formed over conductive pad 372. Additionally, connection 380 may be formed within dielectric layer 372, e.g., via patterning a mask (not shown), etching dielectric layer 374, depositing liner layer 382 and conductive metal 384, and planarization. Connection 380 may be formed such that it contacts conductive pad 372. Further, another conductive pad 388 may be formed over dielectric layer 374 such that it contacts connection 380. As shown, connection 380 extends from conductive pad 372 toward conductive pad 388 in a direction away from front side 302.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method of forming an integrated circuit structure, the method comprising:
providing a substrate having a front side and a back side, the substrate including:
a deep trench (DT) capacitor within the substrate extending toward the back side of the substrate, and
a through silicon via (TSV) adjacent to the DT capacitor within the substrate extending toward the back side of the substrate, the TSV including a metal substantially surrounded by a liner layer and an insulating layer substantially surrounding the liner layer;
etching the back side of the substrate to expose the insulating layer of TSV on the back side of the substrate without exposing the DT capacitor, wherein the etching of the back side of the substrate includes exposing a portion of the insulating layer that is disposed along a sidewall of the TSV; and
forming a first dielectric layer covering the exposed insulating layer of TSV on the back side of the substrate and extending away from the front side of the substrate, a portion of the first dielectric layer being laterally adjacent to the portion of the insulating layer that is disposed along the sidewall of the TSV such that the portion of insulating layer is disposed between the sidewall of the TSV and the portion of the first dielectric layer.

2. The method of claim 1, further comprising:
planarizing the first dielectric layer, after the forming of the first dielectric layer, to a surface of the insulating layer of the TSV that is farthest from the front side of the substrate.

3. The method of claim 2, further comprising:
after the planarizing of the first dielectric layer, removing a portion of the insulating layer of the TSV that is farthest from the front side of the substrate to expose a portion of the liner layer of the TSV; and
forming a conductive pad over the back side of the substrate extending away from the front side of the substrate, the conductive pad covering a portion of the first dielectric layer and the first liner layer of the TSV such that the conductive pad is in electrical connection with the TSV.

4. The method of claim 3, further comprising:
forming a second dielectric layer over the back side of the substrate extending away from the front side of the substrate, the second dielectric layer covering the conductive pad and at least a portion of the first dielectric layer.

5. The method of claim 4, further comprising:
forming a connection within the second dielectric layer connected to the conductive pad.

6. The method of claim 1, wherein the forming of the first dielectric layer includes forming a polymer.

7. The method of claim 1, further comprising:
forming a wire adjacent to and separated from the TSV during the forming of the first dielectric layer.

8. The method of claim 7, further comprising:
forming a connection extending from the wire away from the front side of the substrate to a surface of the first dielectric layer that is farthest from the front side of the substrate;
removing a portion of the insulating layer of the TSV that is farthest from the front side of the substrate to expose a portion of the liner layer of the TSV; and
forming a conductive pad over the TSV, the connection, and at least a portion of the first dielectric layer such that the wire is electrically connected to the TSV by the connection and the conductive pad.

9. The method of claim 8, wherein the etching of the back side of the substrate includes etching the back side of the substrate to expose the DT capacitor on the back side of the substrate.

10. A method of forming an integrated circuit structure, the method comprising:
providing a substrate having a front side and a back side, the substrate including:
a deep trench (DT) capacitor within the substrate extending toward the back side of the substrate, and
a through silicon via (TSV) adjacent to the DT capacitor within the substrate extending toward the back side of the substrate, the TSV including a metal substantially surrounded by a liner layer and an insulating layer substantially surrounding the liner layer;
etching the back side of the substrate to expose the TSV on the back side of the substrate;
forming a first dielectric layer covering the exposed TSV on the back side of the substrate and extending away from the front side of the substrate;
planarizing the first dielectric layer to a surface of the insulating layer of the TSV that is farthest from the front side of the substrate;
removing a portion of the insulating layer of the TSV that is farthest from the front side of the substrate to expose a portion of the liner layer of the TSV; and
forming a conductive pad over the back side of the substrate extending away from the front side of the substrate, the conductive pad covering a portion of the first dielectric layer and the liner layer of the TSV such that the conductive pad is in electrical connection with the TSV.

11. The method of claim 10, further comprising:
forming a second dielectric layer over the back side of the substrate extending away from the front side of the substrate, the second dielectric layer covering the conductive pad and at least a portion of the first dielectric layer.

12. The method of claim 11, further comprising:
forming a connection within the second dielectric layer connected to the conductive pad.

13. The method of claim 10, wherein the forming of the first dielectric layer includes forming a polymer.

14. The method of claim 10, further comprising:
forming a wire adjacent to and separated from the TSV during the forming of the first dielectric layer.

15. The method of claim 14, further comprising:
forming a connection extending from the wire away from the front side of the substrate to a surface of the first dielectric layer that is farthest from the front side of the substrate;
removing a portion of the insulating layer of the TSV that is farthest from the front side of the substrate to expose a portion of the liner layer of the TSV; and
forming a conductive pad over the TSV, the connection, and at least a portion of the first dielectric layer such that the wire is electrically connected to the TSV by the connection and the conductive pad.

16. The method of claim 15, wherein the etching of the back side of the substrate includes etching the back side of the substrate to expose the DT capacitor on the back side of the substrate.

17. A method of forming an integrated circuit structure, the method comprising:
providing a substrate having a front side and a back side, the substrate including:
a deep trench (DT) capacitor within the substrate extending toward the back side of the substrate, and
a through silicon via (TSV) adjacent to the DT capacitor within the substrate extending toward the back side of the substrate, the TSV including a metal substantially surrounded by a liner layer and an insulating layer substantially surrounding the liner layer;
etching the back side of the substrate to expose the TSV on the back side of the substrate;
forming a first dielectric layer covering the exposed TSV on the back side of the substrate and extending away from the front side of the substrate; and
forming a wire adjacent to and separated from the TSV during the forming of the first dielectric layer.

18. The method of claim 17, further comprising:
forming a connection extending from the wire away from the front side of the substrate to a surface of the first dielectric layer that is farthest from the front side of the substrate;
removing a portion of the insulating layer of the TSV that is farthest from the front side of the substrate to expose a portion of the liner layer of the TSV; and
forming a conductive pad over the TSV, the connection, and at least a portion of the first dielectric layer such that the wire is electrically connected to the TSV by the connection and the conductive pad.

19. The method of claim 18, wherein the etching of the back side of the substrate includes etching the back side of the substrate to expose the DT capacitor on the back side of the substrate.

* * * * *